United States Patent [19]
Takata et al.

[11] Patent Number: 5,088,187
[45] Date of Patent: Feb. 18, 1992

[54] APPARATUS FOR AUTOMATICALLY MOUNTING ELECTRONIC COMPONENTS

[75] Inventors: Kazunori Takata; Tsuneshi Akaishi; Masayuki Mohara, all of Gunma, Japan

[73] Assignee: Sanyo Electric Co., Ltd., Osaka, Japan

[21] Appl. No.: 534,611

[22] Filed: Jun. 6, 1990

[30] Foreign Application Priority Data

Jun. 7, 1989 [JP] Japan .................................. 1-144377

[51] Int. Cl.[5] ............................................. H05K 3/30
[52] U.S. Cl. ...................................... 29/705; 29/714; 29/740
[58] Field of Search ......................... 29/705, 714–719, 29/740, 741, 759, 834–836

[56] References Cited

U.S. PATENT DOCUMENTS 4,628,464 12/1986 McConnell .
4,653,664  3/1987 Hineno et al. .
4,675,993  6/1987 Harada .
4,747,198  5/1988 Asai et al. .
4,793,707 12/1988 Hata .

FOREIGN PATENT DOCUMENTS 61-280700 12/1986 Japan .
62-55998  3/1987 Japan .
64-73700  3/1989 Japan .
2186218  8/1987 United Kingdom .

Primary Examiner—Carl E. Hall
Attorney, Agent, or Firm—Armstrong, Nikaido, Marmelstein, Kubovcik & Murray

[57] ABSTRACT

An improved apparatus for automatically mounting electronic components includes a take-out nozzle which is rotated by a nozzle rotating unit based on data on an angular position assumed by each chip-shaped electronic component firmly held on the take-out nozzle, in order to perform a correcting operation so as to allow the electronic component to assume an adequate angular position and, after completion of the correction operation, the respective electronic components are mounted on a printed-circuit board. The apparatus includes a storing unit in which an allowable error range is stored, a comparing unit for determining whether or not the present angular positions assumed by the respective electronic components and recognized by a recognized unit remain within the allowable error range, and a controlling unit for controlling the nozzle rotating unit so as to allow a correcting operation to be repeatedly performed based on results derived from the determination made by the comparing unit, until the respective recognized angular positions remain within the allowable error range.

3 Claims, 22 Drawing Sheets

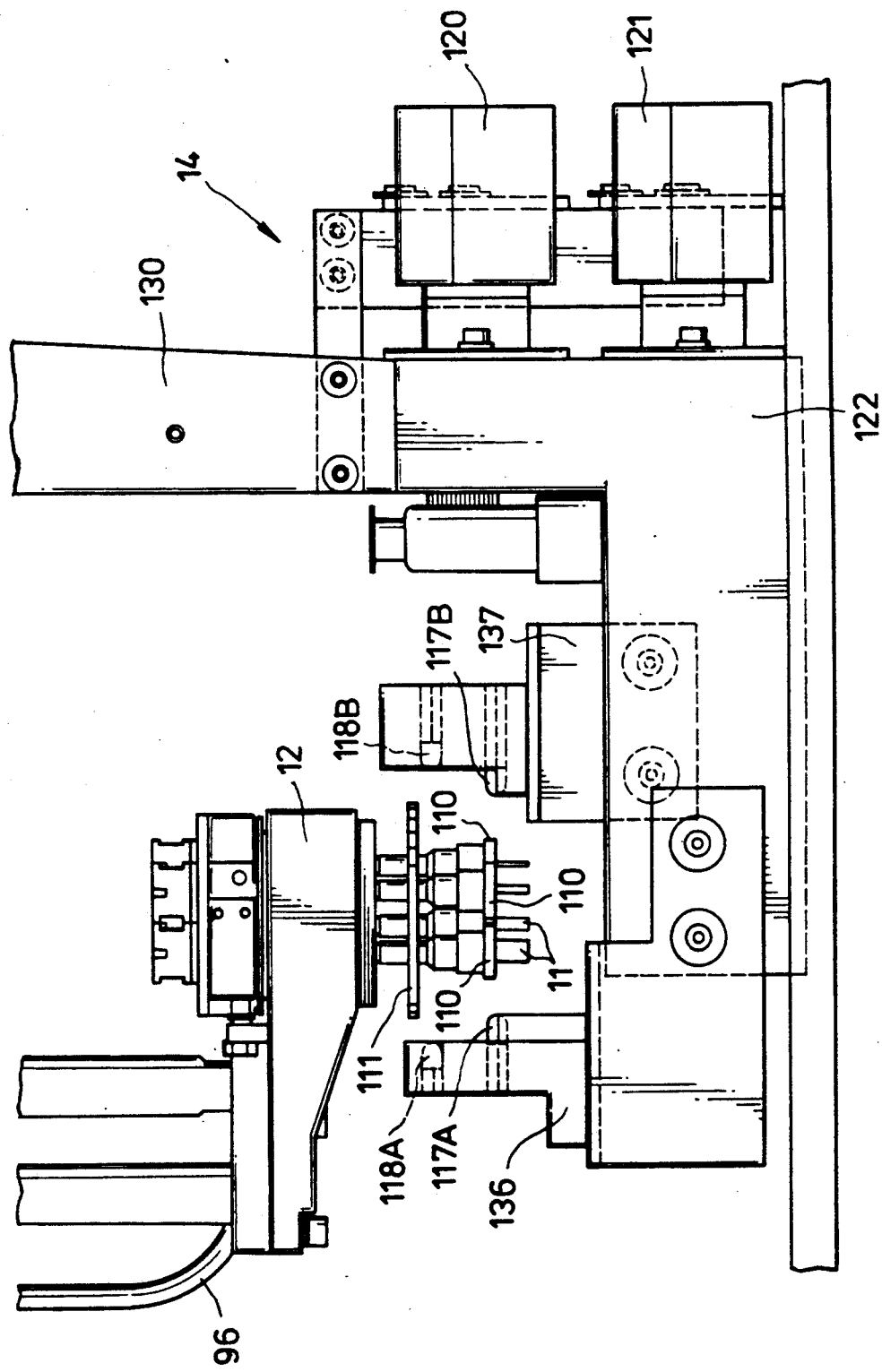

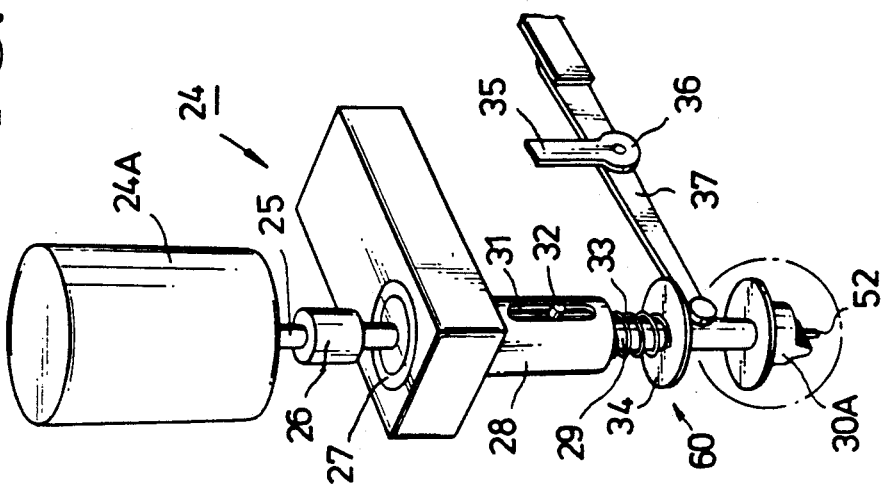
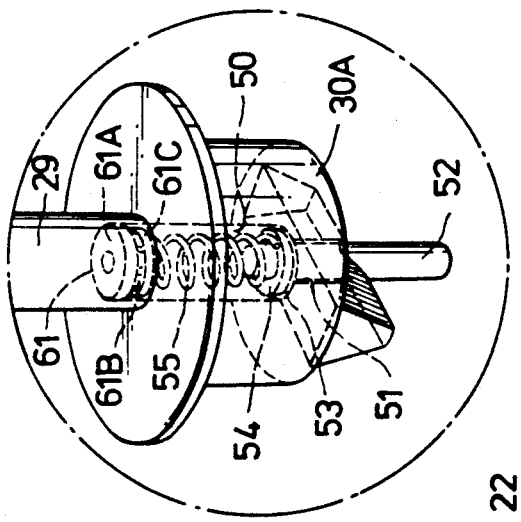
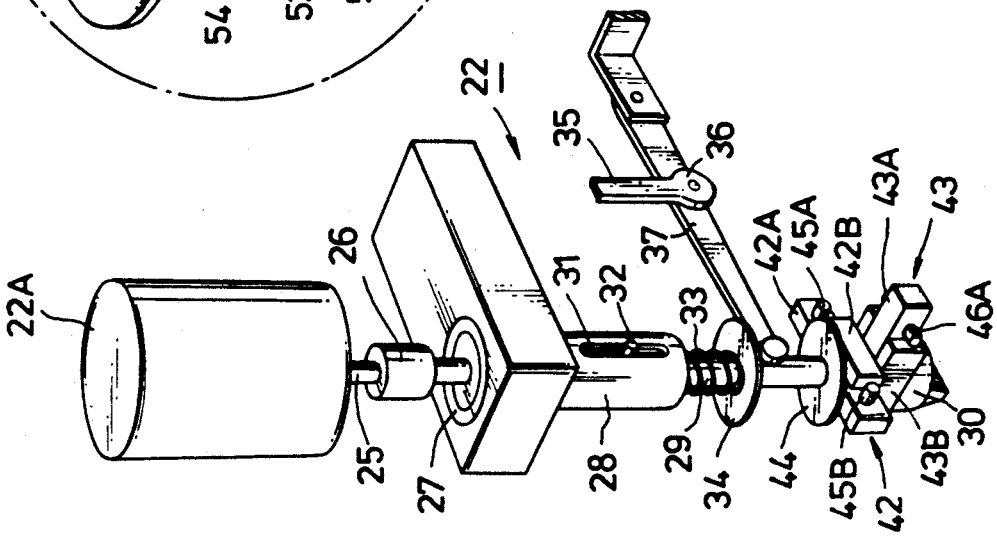

FIG.11

| NUMBER OF COMPONENT | LENGTH | WIDTH | THICKNESS | CODE OF CONFIGURATION | PRESENCE /ABSENCE OF LEAD | NUMBER OF LEADS | LEAD OF PITCH | CLOSED /OPEN SHIFT | ALLOWABLE RANGE OF ERROR | CONTROL COMMAND |
|---|---|---|---|---|---|---|---|---|---|---|
| R1 | X1 | Y1 | T1 | 1 | PRESENCE | MANY | NARROW | — | ±10 | |
| R2 | X2 | Y2 | T2 | 2 | ABSENCE | — | — | 0 | ±20 | |
| R3 | X3 | Y3 | T3 | 3 | PRESENCE | SMALL | WIDE | 0 | ±14 | |
| — | — | — | — | — | — | — | — | — | — | |
| — | — | — | — | — | — | — | — | — | — | |
| RE | XE | YE | TE | 4 | ABSENCE | — | — | — | ±13 | E |

| STEP NUMBER | X-COORDINATE | Y-COORDINATE | ANGLE | COMPONENT | CONTROL COMMAND |
|---|---|---|---|---|---|
| 1 | X1 | Y1 | Θ1 | R1 | |
| 2 | X2 | Y2 | Θ2 | R2 | |
| 3 | X3 | Y3 | Θ3 | R3 | |
| ¦ | ¦ | ¦ | ¦ | ¦ | |
| ¦ | ¦ | ¦ | ¦ | ¦ | |
| ¦ | ¦ | ¦ | ¦ | ¦ | |
| E | XE | YE | ΘE | RE | E |

FIG.20

| NUMBER OF COMPONENT | LENGTH | WIDTH | THICKNESS | CODE OF CONFIGURATION | PRESENCE /ABSENCE OF LEAD | NUMBER OF LEADS | LEAD OF PITCH | ALLOWABLE RANGE OF ERROR | CONTROL COMMAND |
|---|---|---|---|---|---|---|---|---|---|
| R1 | X1 | Y1 | T1 | 5 | ABSENCE | — | — | ±20 | |
| R2 | X2 | Y2 | T2 | 6 | PRESENCE | MANY | WIDE | ±15 | |
| R3 | X3 | Y3 | T3 | 7 | PRESENCE | SMALL | NARROW | ±11 | |
| — | — | — | — | — | — | — | — | — | |
| — | — | — | — | — | — | — | — | — | |
| RE | XE | YE | TE | 8 | PRESENCE | MANY | NARROW | ±5 | E |

FIG.21

| STEP NUMBER | X-COORDINATE | Y-COORDINATE | ANGLE | COMPONENT | CLOSED/OPEN SHIFT | CONTROL COMMAND |
|---|---|---|---|---|---|---|
| 1 | X1 | Y1 | θ1 | R1 | 0 | |
| 2 | X2 | Y2 | θ2 | R2 | 0 | |
| 3 | X3 | Y3 | θ3 | R3 | 1 | |
| — | — | — | — | — | — | |
| — | — | — | — | — | — | |
| E | XE | YE | θE | RE | 1 | E |

| NUMBER OF COMPONENT | LENGTH | WIDTH | THICKNESS | CODE OF CONFIGURATION | PRESENCE /ABSENCE OF LEAD | NUMBER OF LEADS | PITCH OF LEAD | ALLOWABLE RANGE OF ERROR | CONTROL COMMAND |
|---|---|---|---|---|---|---|---|---|---|
| R1 | X1 | Y1 | T1 | 1 | PRESENCE | MANY | NARROW | ±10 | |
| R2 | X2 | Y2 | T2 | 2 | ABSENCE | — | — | — | |
| R3 | X3 | Y3 | T3 | 3 | PRESENCE | SMALL | WIDE | — | |
| — | — | — | — | — | — | — | — | — | |
| — | — | — | — | — | — | — | — | — | |
| RE | XE | YE | TE | 4 | ABSENCE | — | — | ±13 | E |

FIG.22

| STEP NUMBER | X-COORDINATE | Y-COORDINATE | ANGLE | COMPONENT | ALLOWABLE RANGE OF ERROR | CONTROL COMMAND |
|---|---|---|---|---|---|---|
| 1 | X1 | Y1 | θ1 | R1 | ±11 | |
| 2 | X2 | Y2 | θ2 | R2 | — | |
| 3 | X3 | Y3 | θ3 | R3 | — | |
| — | — | — | — | — | — | |
| — | — | — | — | — | — | |
| E | XE | YE | θE | RE | ±5 | E |

| NUMBER OF COMPONENT | LENGTH | WIDTH | THICKNESS | CODE OF CONFIGURATION | PRESENCE /ABSENCE OF LEAD | NUMBER OF LEADS | PITCH OF LEAD | CLOSED /OPEN SHIFT | LIMITED NUMBER OF TIMES OF CORRECTION | ALLOWABLE RANGE OF ERROR | CONTROL COMMAND |
|---|---|---|---|---|---|---|---|---|---|---|---|
| R1 | X1 | Y1 | T1 | 1 | PRESENCE | MANY | NARROW | 1 | 5 | ±10 | |
| R2 | X2 | Y2 | T2 | 2 | ABSENCE | — | — | 0 | 0 | ±20 | |
| R3 | X3 | Y3 | T3 | 3 | PRESENCE | SMALL | WIDE | 0 | 0 | ±14 | |
| --- | --- | --- | --- | --- | --- | --- | --- | --- | --- | --- | |
| RE | XE | YE | TE | 4 | ABSENCE | — | — | 1 | 4 | ±13 | E |

| NUMBER OF COMPONENT | LENGTH | WIDTH | THICKNESS | CODE OF CONFIGURATION | PRESENCE /ABSENCE OF LEAD | NUMBER OF LEAD | PITCH OF LEAD | CLOSED /OPEN SHIFT | ALLOWABLE RANGE OF ERROR | CONTROL COMMAND |
|---|---|---|---|---|---|---|---|---|---|---|
| R1 | X1 | Y1 | T1 | 1 | PRESENCE | MANY | NARROW | — | ±10 | |
| R2 | X2 | Y2 | T2 | 2 | ABSENCE | — | — | 0 | ±20 | |
| R3 | X3 | Y3 | T3 | 3 | PRESENCE | SMALL | WIDE | 0 | ±14 | |
| — | — | — | — | — | — | — | — | — | — | |
| — | — | — | — | — | — | — | — | — | — | |
| RE | XE | YE | TE | 4 | ABSENCE | — | — | — | ±13 | E |

| STEP NUMBER | X-COORDINATE | Y-COORDINATE | ANGLE | COMPONENT | CLOSED/OPEN SHIFT | LIMITED NUMBER OF TIMES OF CORRECTION | ALLOWABLE RANGE OF ERROR | CONTROL COMMAND |
|---|---|---|---|---|---|---|---|---|
| 1 | X1 | Y1 | θ1 | R1 | 0 | 0 | ±20 | |
| 2 | X2 | Y2 | θ2 | R2 | 0 | 0 | ±15 | |
| 3 | X3 | Y3 | θ3 | R3 | — | 3 | ±11 | |
| --- | --- | --- | --- | --- | --- | --- | --- | |
| E | XE | YE | θE | RE | — | 2 | ±5 | E |

FIG.27

| STEP NUMBER | X-COORDINATE | Y-COORDINATE | ANGLE | ANGLE COMPONENT | CLOSED/OPEN SHIFT | ALLOWABLE RANGE OF ERROR | CONTROL COMMAND |
|---|---|---|---|---|---|---|---|
| 1 | X1 | Y1 | θ1 | R1 | 0 | ±20 | |
| 2 | X2 | Y2 | θ2 | R2 | 0 | ±15 | |
| 3 | X3 | Y3 | θ3 | R3 | — | ±11 | |
| — | — | — | — | — | — | — | |
| E | XE | YE | θE | RE | — | ±5 | E |

FIG.28

| STEP NUMBER | X-COORDINATE | Y-COORDINATE | ANGLE | COMPONENT SHIFT | CLOSED/OPEN SHIFT | LIMITED NUMBER OF TIMES OF CORRECTION | CONTROL COMMAND |
|---|---|---|---|---|---|---|---|
| 1 | X1 | Y1 | θ1 | R1 | 0 | | |
| 2 | X2 | Y2 | θ2 | R2 | 0 | 0 | |
| 3 | X3 | Y3 | θ3 | R3 | 1 | | |
| --- | --- | --- | --- | --- | --- | --- | |
| E | XE | YE | θE | RE | 1 | 5 | E |

FIG.29

| NUMBER OF COMPONENT | LENGTH | WIDTH | THICKNESS | CODE OF CONFIGURATION | PRESENCE /ABSENCE OF LEAD | NUMBER OF LEADS | PITCH OF LEAD | ALLOWABLE RANGE OF ERROR | LIMITED NUMBER OF TIMES OF CORRECTION | CONTROL COMMAND |
|---|---|---|---|---|---|---|---|---|---|---|
| R1 | X1 | Y1 | T1 | 5 | ABSENCE | — | — | — | 3 | |
| R2 | X2 | Y2 | T2 | 6 | PRESENCE | MANY | WIDE | ±20 | 4 | |
| R3 | X3 | Y3 | T3 | 7 | PRESENCE | SMALL | NARROW | ±15 | 5 | |
| — | — | — | — | — | — | — | — | ±11 | — | — |
| RE | XE | YE | TE | 8 | PRESENCE | MANY | NARROW | ±5 | 6 | E |

FIG.30

| STEP NUMBER | X-COORDINATE | Y-COORDINATE | ANGLE | COMPONENT | CLOSED/OPEN SHIFT | ALLOWABLE RANGE OF ERROR | CONTROL COMMAND |
|---|---|---|---|---|---|---|---|
| 1 | X1 | Y1 | θ1 | R1 | 0 | | |
| 2 | X2 | Y2 | θ2 | R2 | 0 | ±10 | |
| 3 | X3 | Y3 | θ3 | R3 | — | | |
| — | — | — | — | — | — | | |
| — | — | — | — | — | — | | |
| E | XE | YE | θE | RE | 1 | 0 | E |

1

APPARATUS FOR AUTOMATICALLY MOUNTING ELECTRONIC COMPONENTS

BACKGROUND OF THE INVENTION

1. FIELD OF THE INVENTION

The present invention relates to an apparatus for automatically mounting electronic components wherein a take-out nozzle is rotated by a nozzle rotating unit based on data on an angular position assumed by each chip-shaped electronic component firmly held on the take-out nozzle, the angular position being recognized by a recognizing unit, in order to perform a correcting operation so as to allow the electronic component to assume an adequate angular position, and after completion of the correcting operation, the respective electronic components are mounted on a printed-circuit board.

2. DESCRIPTION OF THE PRIOR ART

A typical conventional apparatus of the foregoing type for automatically mounting electronic components has been disclosed, e.g., in an official gazette of Japanese Laid-Open Patent NO. 55998/1987. According to this prior invention, the apparatus includes nozzle selecting means for selecting one of plural kinds of of suction nozzles to be used by rotationally driving one of a plurality of turn holders corresponding to the selected suction nozzle, the turn holders being arranged round the outer periphery of an intermittently rotatable supporting member so that the suction nozzles are rotatably held on the turn holders while a distance corresponding to a pitch of intermittent rotary movement of the supporting member is held between adjacent turn holders, rotational driving of the turn holder being effected corresponding to a position on the passage for the turn holders where intermittent rotational movement of the turn holders is interrupted, component feeding means for feeding an electronic component to the selected suction nozzle thereby to firmly hold the electronic component on the turn holder under the effect of air suction, position detecting means for detecting the present angular position assumed by the electronic component firmly held on the suction nozzle, and nozzle rotating means for rotationally driving the suction nozzle having the electronic component firmly held thereon under the effect of air suction thereby to set or correct the present angular position of the electronic component based on data derived from the detection of the present angular position assumed by the electronic component. The aforementioned plural means are arranged one after another as seen in the direction of turning movement of the intermittent rotary supporting member so that the electronic components are successively mounted on the printed-circuit board.

With the conventional apparatus as constructed in the above-described manner, in a case where data on the present angular position assumed by the electronic component firmly held on the suction nozzle do not coincide with data on an angular position preset for the electronic component, the suction nozzle is rotated by the nozzle rotating means, until the data on the present angular position become coincident with data on the preset angular position of the electronic component. With some electronic component, however, even when it should be mounted on the printed-circuit board with a high accuracy by rotating the suction nozzle, there arises a problem that the electronic component is incorrectly mounted on the printed-circuit board at an angular position offset from the preset angular position, because it has been not heretofore confirmed that the electronic component is exactly mounted on the printedcircuit board by rotating the suction nozzle.

Another conventional apparatus of the aforementioned type is disclosed in an official gazette of U.S. Pat. No. 4,747,198. According to this prior invention, after the present angular position assumed by an electronic component is recognized, a suction tube is rotated so as to eliminate positional deviation of the electronic component. However, it has been found that the same problem as described above arises likewise with this conventional apparatus.

SUMMARY OF THE INVENTION

The present invention has been made with the foregoing background in mind.

An object of the present invention is to provide an apparatus for automatically mounting electronic components wherein an angular position assumed by each electronic component is recognized after completion of a correcting operation for the electronic component for the purpose of increasing a positional accuracy with the electronic component, and if it is found that the present angular position does not remain within an allowable error range, another correcting operation is repeatedly performed until the recognized angular position remains within the allowable error range.

Other object of the present invention is to provide an apparatus for automatically mounting electronic components wherein an open-loop correction for correcting rotation of a suction nozzle just by one time depending on the kind of each electronic component after recognition of the present angular position assumed by the electronic component as well as a closed-loop correction for correcting rotation of the suction nozzle so as to allow a difference between the angular position recognized under a condition that rotational correction can repeatedly be carried out and an angular position adequately preset for the electronic component to remain within a certain allowable error range are selectively used in order to assure that the apparatus can widely be used in many fields in an electronic industry.

To accomplish the above objects, there is provided according to one aspect of the present invention an apparatus for automatically mounting electronic components wherein a take-out nozzle is rotated by a nozzle rotating unit based on data on an angular position assumed by each chip-shaped electronic component firmly held on the take-out nozzle, the angular position being recognized by a recognizing unit, in order to perform a correcting operation so as to allow the electronic component to assume an adequate angular position, and after completion of the correcting operation, the respective electronic components are mounted on a printed-circuit board, wherein the apparatus includes a storing unit in which an allowable error range preset for angular positions assumed by the respective electronic components is stored, a comparing unit for determining whether or not the present angular positions assumed by the respective electronic components and recognized by the recognizing unit remain the allowable error range which has been stored in the storing unit, and a controlling unit for controlling the nozzle rotating means so as to allow a correcting operation to be repeatedly performed based on results derived from the determination made by the comparing unit, until the respective recognized angular positions remain within the allowable error range.

According to other aspect of the present invention, there is provided an apparatus of the aforementioned type, wherein the apparatus includes a storing unit in which an allowable error range preset for an angular position assumed by each electronic component is stored, a comparing unit for determining whether or not the present angular positions assumed by the electronic components and recognized by a recognizing unit remain within the allowable error range which has been stored in the storing unit, and a controlling unit for controlling a nozzle rotating unit so as to allow a correcting operation to be repeatedly performed based on results derived from the determination made by the comparing unit, until the respective recognized angular positions remain within the allowable error range.

According to another aspect to the present invention, there is provided an apparatus of the aforementioned type, wherein the apparatus includes a storing unit in which an allowable range preset for angular positions assumed by electronic components is stored, a comparing unit for determining whether or not the present angular positions assumed by the respective electronic components and recognized by the recognizing unit remain within the allowable error range which has been stored in the storing unit, a counter for counting the number of times of correcting operations which have been repeatedly performed based on results derived from the determination made by the comparing unit, and a controlling unit for controlling the nozzle rotating means so as to allow a correcting operation to be repeatedly performed, until the respective recognized angular positions which have been recognized by the recognizing unit after completion of the respective correction operations remain within the allowable error range and moreover allowing the electronic component firmly held on the take-out nozzle not to be mounted on a printed-circuit board, when the number of times of the correcting operations which have been performed reaches the number of times of correcting operations which has been preset by the counter.

According to another aspect of the present invention, there is provided an apparatus of the aforementioned type, wherein the apparatus includes a storing unit in which an allowable error range preset for angular positions assumed by the respective electronic components is stored, a comparing unit for determining whether or not the present angular positions assumed by respective electronic components and recognized by a recognizing unit remain within the allowable error range which has been stored in the storing unit, a counter for counting the number of times of correcting operations which have been repeatedly performed based on results derived from the determination made by the comparing unit, and a controlling unit for controlling a nozzle rotating unit so as to allow a correcting operation to be repeatedly performed, until the respective angular positions which have been recognized by a recognizing unit after completion of the respective correcting operations remain within the allowable error range and moreover allowing the electronic components firmly held on the take-out nozzle not to be mounted on a printed-circuit board, when the number of times of correcting operations which has been preset for each electronic component or for each step of mounting the electronic components reaches the number of times of counting operations which have been performed by the counter.

According to another aspect of the present invention, there is provided an apparatus of the aforementioned type, wherein the apparatus includes a storing unit in which an allowable error range preset for angular positions assumed by the respective electronic components is stored, a comparing unit for determining whether or not the present angular positions assumed by the respective electronic components and recognized by a recognizing unit remain within the allowable error range which has been stored in the storing unit, a counter for counting the number of times of correcting operations which have been repeatedly performed based on results derived from the determination made by the comparing unit, a determining unit for determining the number of times of correcting operations which have been performed, with reference to the allowable error range, and a controlling unit for controlling a nozzle rotating unit so as to allow a correcting operation to be repeatedly performed, until the respective angular positions which have been recognized by a recognizing unit after completion of the respective correcting operations remain within the allowable error range and moreover allowing the electronic component firmly held on the take-out nozzle not to be mounted on a printed-circuit board, when the number of times of correcting operations which has been determined by the determining unit reaches the number of times of counting operations to be performed by the counter.

According to another aspect of the present invention, there is provided an apparatus of the aforementioned type, wherein the apparatus includes a storing unit in which a program for an open-loop correcting operation for correcting rotation of a take-out nozzle just by one time after completion of recognition made by a recognizing unit as well as a program for a closed-loop correcting operation to be performed so as to allow a difference between the angular position which has been recognized such that rotational correcting operation can repeatedly be performed and an adequate angular position to remain within a certain allowable error range, a selecting unit for selecting one of the programs which have been stored in the storing unit, and a controlling unit for carrying out control so as to perform a correcting operation in accordance with the program which has been selected by the selecting unit.

According to another aspect of the present invention, there is provided an apparatus of the aforementioned type, wherein the apparatus includes a storing unit in which a program for an open-loop correcting operation for correcting rotation of a take-out nozzle just by one time after completion of recognition made by a recognizing unit as well as a program for a closed-loop correcting operation to be performed so as to allow a difference between the angular position which has been recognized such that a rotational correcting operation can repeatedly be performed and an adequate angular position to remain within a certain error range is stored, a selecting unit for selecting one of the programs which has been stored in the storing unit, depending on the kind of electronic components to be mounted on a printed-circuit board, and a controlling unit for controlling a correcting operation in accordance with the program which has been selected by the selecting unit.

According to further another aspect of the present invention, there is provided an apparatus of the aforementioned type, wherein the apparatus includes a storing unit in which a program for an open-loop correcting operation for correcting rotation of a take-out nozzle merely by one time as well as a program for a closed-loop correcting operation to be performed so as to allow a difference between the angular position which has been recognized such that a rotational correcting operation can repeatedly be performed and an adequate angular position to remain within a certain allowable error range, a selecting unit for selecting one of the programs which have been stored in the storing unit at every time when an electronic component is mounted on a printed-circuit board, and a controlling unit for carrying out control so as to perform a correcting operation in accordance with the program which has been selected by the selecting unit.

According to the present invention, the comparing unit determines whether or not results derived from recognition of the recognizing unit representative of the present angular position assumed by an electronic component remains within the allowable error range which has been stored in the storing unit. If it is found that the present angular position does not remain within the allowable error range, the controlling unit issues a command for controlling the nozzle rotating unit so as to allow another correcting operation to be performed again.

In addition, the comparing unit likewise determines whether or not results derived from the recognition of the recognizing unit representative of the present angular position assumed by the electronic component remain within the allowable error range which has been preset for each electronic component and stored in the storing unit. If it is found that the present angular position of the electronic component does not remain within the allowable error range, the controlling unit issues a command for controlling the nozzle rotating unit so as to allow another correcting operation to be performed again.

Additionally, the comparing unit likewise determines whether or not results derived from the recognition of the recognizing unit representative of the present angular position of the electronic component remain within the allowable error range which has been stored in the storing unit. If it is found that the present angular position does not remain within the allowable error range, the controlling unit issues a command for controlling the nozzle rotating unit so as to allow another correcting operation to be performed again, and when the number of times of correcting operations which has been set for each electronic component or for each step for mounting electronic components reaches the number of times of correcting operations which has been set by the counter, the controlling unit carries out control such that the electronic component firmly held on the take-out nozzle should not be mounted on the printed-circuit board.

Further, the comparing unit likewise determines whether or not results derived from the recognition of the recognizing unit representative of the present angular position assumed by the electronic component remain within the allowable error range which has been stored in the storing unit. If it is found that the present angular range of the electronic component remains within the allowable error range, the controlling unit issues a command for another correcting operation to be performed again, and when the number of times of correcting operations which has been determined by the determining unit reaches the number of times of correcting operations which has been set by the counter, the controlling unit carries out control such that the electronic component should not be mounted on the printed-circuit board.

According to the present invention, the selecting unit selects one of the program for an open-loop correcting operation and the program for a closed-loop correcting operation both of which have been stored in the storing unit. Then, the controlling unit carries out control such that a correcting operation for correcting rotation of the take-out nozzle is performed in accordance with the selected program.

In addition, the selecting unit likewise selects one of the program for an open-loop correcting operation and the program for a closed-loop correcting operation both of which have been stored in the storing unit, depending on the kind of electronic components to be mounted. Then, the controlling unit carries out control such that a correcting operation for correcting rotation of the take-out nozzle is performed in accordance with the selected program.

Further, the selecting unit likewise selects one of the program for an open-loop correcting operation and the program for a closed-loop correcting operation both of which have been stored in the storing unit, at every time when an electronic component is mounted on the printed-circuit board. Then, the controlling unit carries out control such that a correcting operation for correcting rotation of the take-out nozzle is performed in accordance with the selected program.

Other objects, features and advantages of the present invention will become apparent from reading of the following description which has been made with reference to the accompanying drawings.

BRIEF DESCRIPTION OF THE DRAWINGS

The present invention is illustrated in the following drawings in which;

FIG. 5 is a perspective view, particularly a first nozzle rotation position locating unit in the apparatus of the present invention.

FIG. 6 is a fragmentary sectional side view of the first nozzle rotation position locating unit in FIG. 5.

FIG. 7 is a side view of a recognizing unit, particularly illustrating how the recognizing unit is mounted in the apparatus.

FIG. 8 is a perspective view, particularly illustrating a third nozzle rotation position locating unit.

FIG. 9 is a fragmentary enlarged perspective view of the third nozzle rotation position locating unit in FIG. 8.

FIG. 11 is a diagram in the form of a table which illustrates data on closed/open shift for electronic components depending on the kind of each component, wherein the data are displayed on the screen of a monitor television.

FIGS. 20 and 21 are a diagram in the form of a table, respectively, which illustrates data on closed/open shift to be executed by an apparatus for automatically mounting electronic components in accordance with other embodiment, wherein the data are displayed on the screen of the monitor television.

FIGS. 22 and 23 are a diagram in the form of a table, respectively, which illustrates data on closed/open shift to be executed by an apparatus for automatically mounting electronic components in accordance with another embodiment of the present invention, wherein the data are displayed on the screen of the monitor television.

FIGS. 24 to 30 are a diagram in the form of a table, respectively, which illustrates data concerning a setting operation for the limited number of times of correcting operations to be performed by the apparatus of the present invention.

DESCRIPTION OF THE PREFERRED EMBODIMENTS

Now, the present invention will be described below in detail hereinafter with reference to the accompanying drawings which illustrate preferred embodiments thereof.

Figure 1:
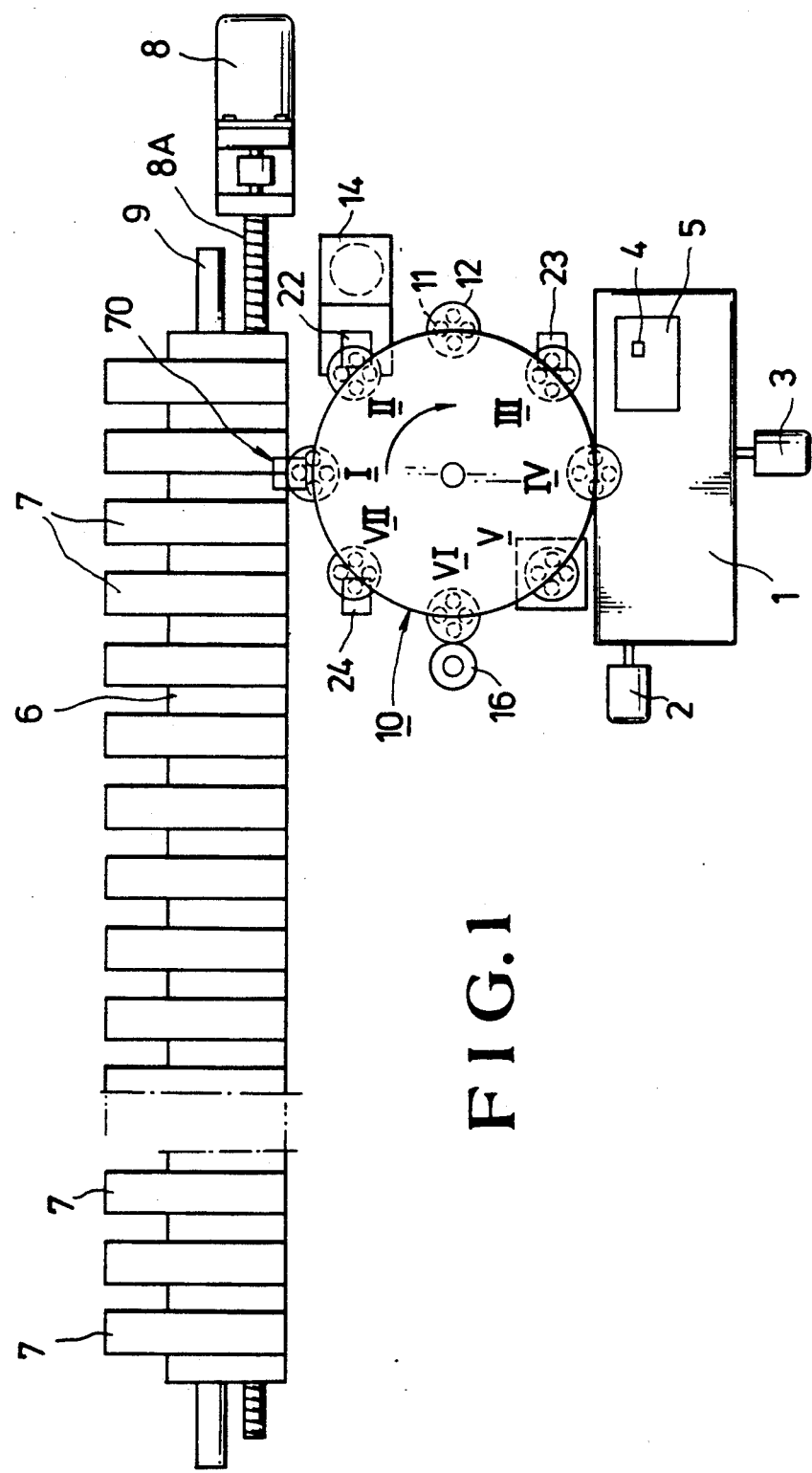
FIGS. 1 and 10 illustrate by way of a plan view and a circuit diagram an apparatus for automatically mounting electronic components in accordance with an embodiment of the present invention, respectively.

In FIG. 1, reference numeral 1 designates a X-Y coordinate table (hereinafter referred to as a table) adapted to be displaced in both directions, i.e., in the X-direction and in the Y-direction by driving a X-coordinate servo-motor 2 and a Y-coordinate servo-motor 3. A printed-circuit board 5 for allowing an electronic component (hereinafter referred to as a chip component) 4 to be mounted thereon is placed on the table 1.

Reference numeral 6 designates a component feeding bed on which a number of component feeding devices 7 are arranged one after another in a spaced relationship. The bed 6 is displaced in the X-direction (in the lateral direction as seen in FIG. 1) by rotating a ball screw 8A by a servo-motor 8, while displacement of the bed 6 is guided by a guide rod 9.

Figure 10:
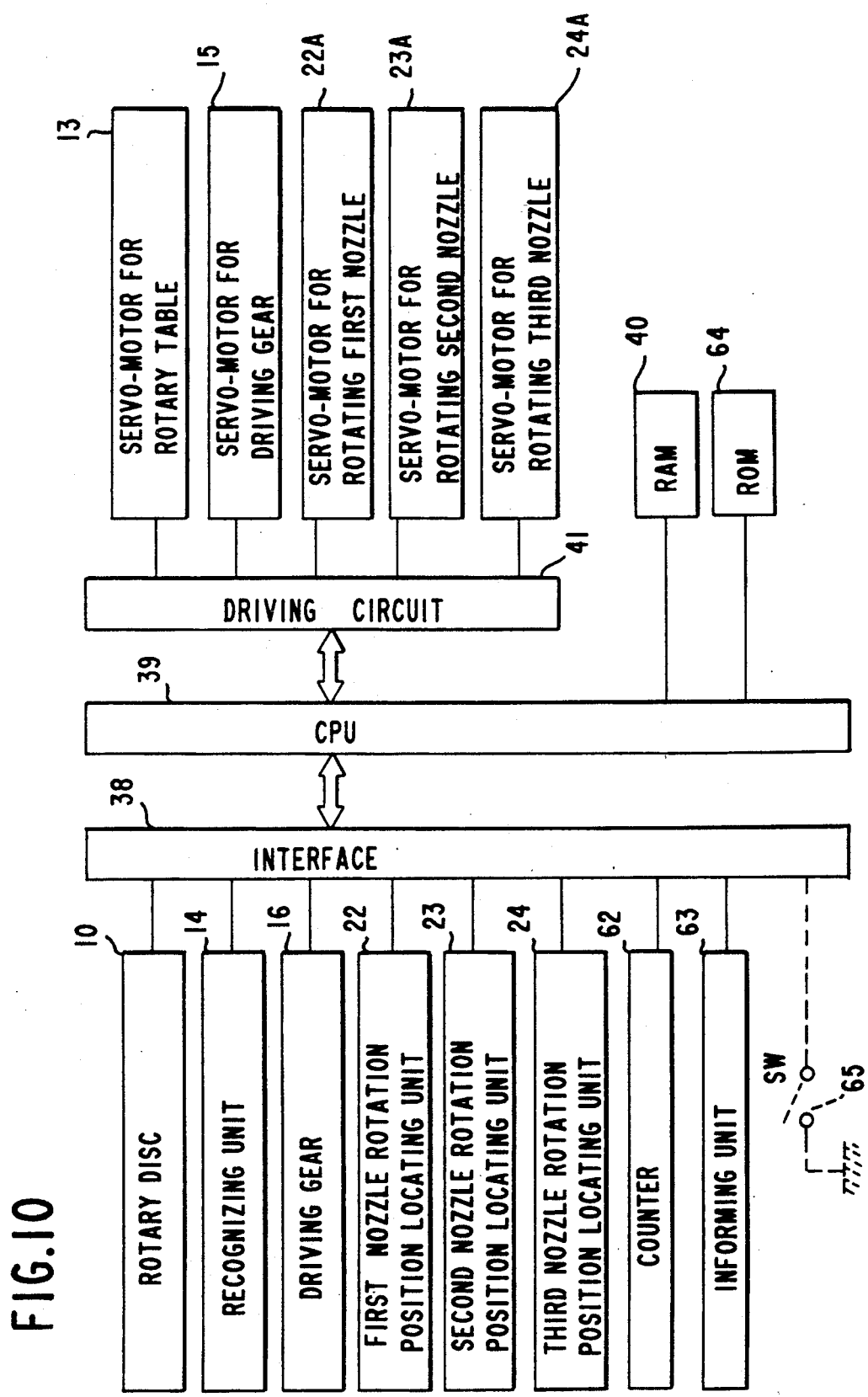

Reference numeral 10 designates a turntable on which a number of suction heads 12 each serving as a take-out head are arranged on the bottom surface thereof in an equally spaced relationship. Each suction head 12 includes a plurality of suction nozzles 11 each serving to take the chip component 4 out of the component feeding device 7 to convey it further. The turntable 10 is intermittently turned by driving a servo-motor 13 which is shown in FIG. 10 to be described later.

Figure 3:
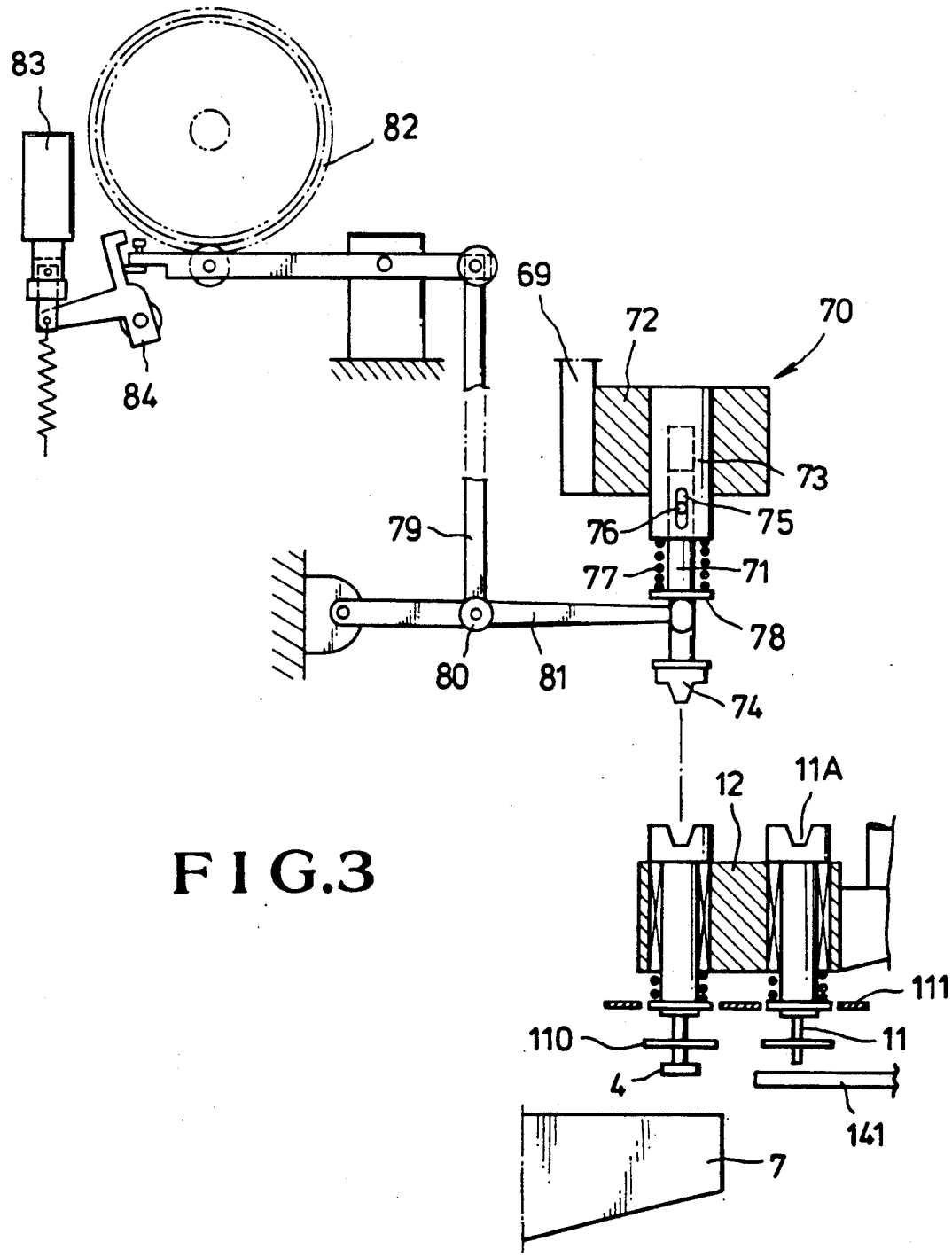
FIG. 3 is a sectional side view, particularly illustrating a suction station in the apparatus of the present invention.
Figure 4:
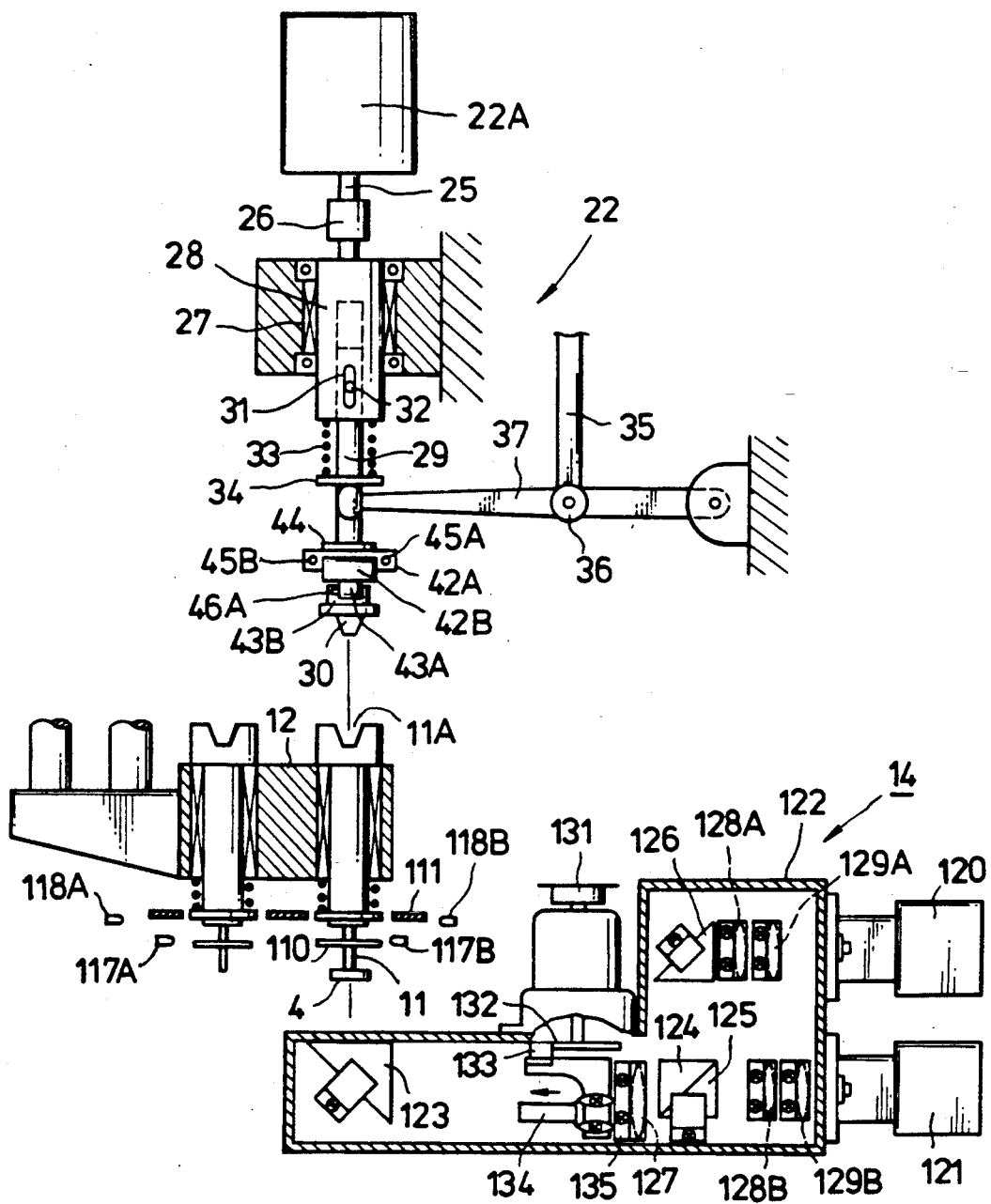
FIG. 4 is a sectional side view, particularly illustrating a first nozzle rotation correcting station in the apparatus of the present invention.
Figure 15:
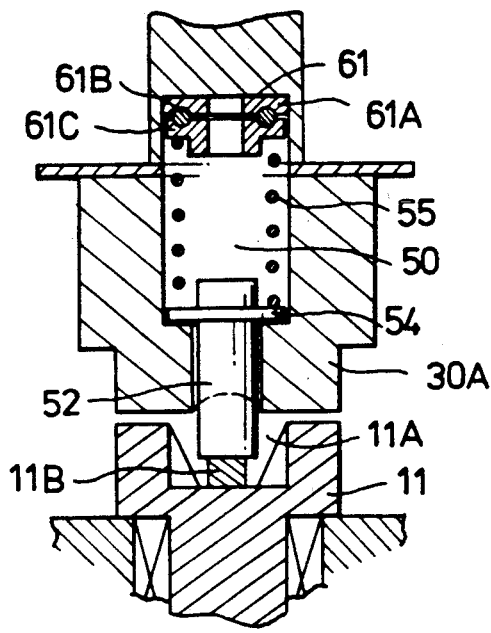
FIGS. 15 and 16 are a fragmentary sectional view, particularly illustrating engagement of the engagement portion of a nozzle rotation rod with the engagement groove of a suction nozzle, respectively.
Figure 16:
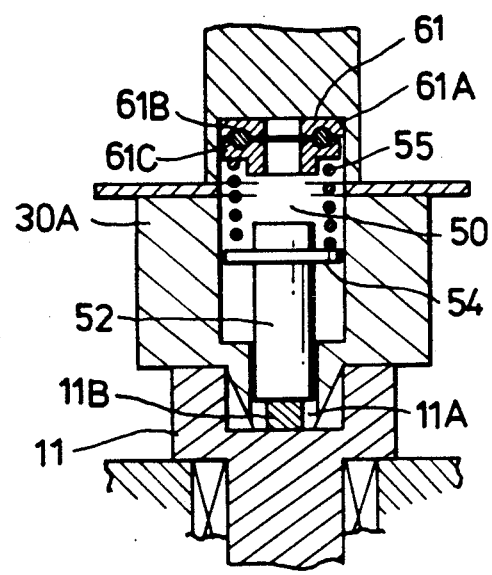

In FIGS. 3, 4 and 7, reference numeral 110 designates a first delivering plate and reference numeral 111 designates a second distributing plate disposed below the suction nozzles 11. The first delivering plate 110 made of acrylic resin or glass is disposed corresponding to each suction nozzle 11, and the outer periphery of the second distributing plate 111 extends round all the suction nozzles 11. The suction nozzle 11 is formed with an engagement groove 11A (see FIGS. 3 and 4) on the upper surface thereof so that an engagement portion 30 to be described later is brought in engagement with the engagement groove 11A. In addition, the nozzle 11 is provided with a contact portion 11B (see FIGS. 15, 16 and 17) so that a contact rod 52 to be described later comes in contact with the contact portion 11B It should be noted that the suction nozzle 11 may be formed with two engagement grooves 11A which intersect each other at a right angle.

Reference numeral I designates a suction station for taking chip components 4 out of the component feeding devices 7.

Reference numeral II designates a first nozzle rotation correcting station where the rotated state of the chip component 4 is corrected based on results derived from recognition conducted by a recognizing unit 14. This recognizing unit 14 is adapted to recognize the present rotated state of the chip component 4 which has been firmly held on the suction nozzle 11 under the effect of air suction. While the chip components 4 are held in the first nozzle rotation correcting station II, correction is executed for the chip components 4, e.g., SOP (small outline package), QFP (quad flat package) or the like component each having leads. A chip component 4 to be corrected may have many leads. Basically, the first nozzle rotation correction station II deals with chip components 4 which should be mounted on the pattern of the printed-circuit board 5 with a high accuracy. When it is found that correction has been completed with the chip component 4, each chip component 4 is recognized again by the recognizing unit 14. When it is found that correction has been not completed, another correcting operation is performed again. Therefore, the aforementioned correcting operation (hereinafter referred to as closed-loop correction) is repeatedly performed until correction is completed (until an error is alleviated within a certain error range).

Reference numeral III designates a second nozzle rotation correcting station where the rotated state of the chip component 4, e.g., LCC (leadless chip carrier) or the like component having no lead wire or the chip component 4 having a few lead wires is corrected. While the chip component 4 is held in the second nozzle rotation correcting station III, a correcting operation (hereinafter referred to as open-loop correction) is performed for the chip component 4 just by one time which has been not corrected in the first nozzle rotation correcting station II, based on results derived from recognition of the recognizing unit 14.

Reference numeral IV designates a mounting station where the chip component 4 which has been corrected in the first nozzle rotation correcting station II or the second nozzle rotation correcting station III is mounted on the printed-circuit board 5.

Reference numeral V designate a discharging station where the chip component 4 which has been identified, e.g., as a chip component which is held in an upright standing state under the effect of air suction or as a chip component which fails to be correctly held under the effect of air suction or as a different chip component which should not be mounted is discharged to other location, based on a result derived from the recognition of the recognizing unit 14.

Reference numeral VI designates a nozzle selecting station where a suction nozzle 11 to corresponding to a chip component 4 to be firmly held on the suction nozzle 11 in the suction station I under the effect of air suction is selected. Each suction head 12 is formed with a number of gear teeth (not shown) round the outer periphery thereof which are adapted to mesh with a drive gear 16 serving as nozzle selecting means. After meshing engagement of the gear teeth on the suction head 12 with the drive gear 16 which has been displaced by a driving system (not shown), the drive gear 16 is rotated by a servo-motor 15 (see FIG. 10) until a required suction nozzle 11 is selected.

Reference numeral VII designates a nozzle original point position locating station where an original point position for determining the direction of rotation of the suction nozzle 11 corresponding to the orientation of the chip components 4 staying at a waiting position is correctly adjusted, when the chip component 4 is taken out by the suction nozzle 11 staying in the suction station I.

It should be noted that the closed-loop correction should not be limited only to the chip components 4 each having many leads but is may be carried out for the chip components 4 having leads of which width is dimensioned narrow or the chip components 4 having leads of which distance between adjacent ones is dimensioned small and that the closed-loop correction is often required, particularly in a case where each chip component 4 includes leads each having a long length.

Figure 2:
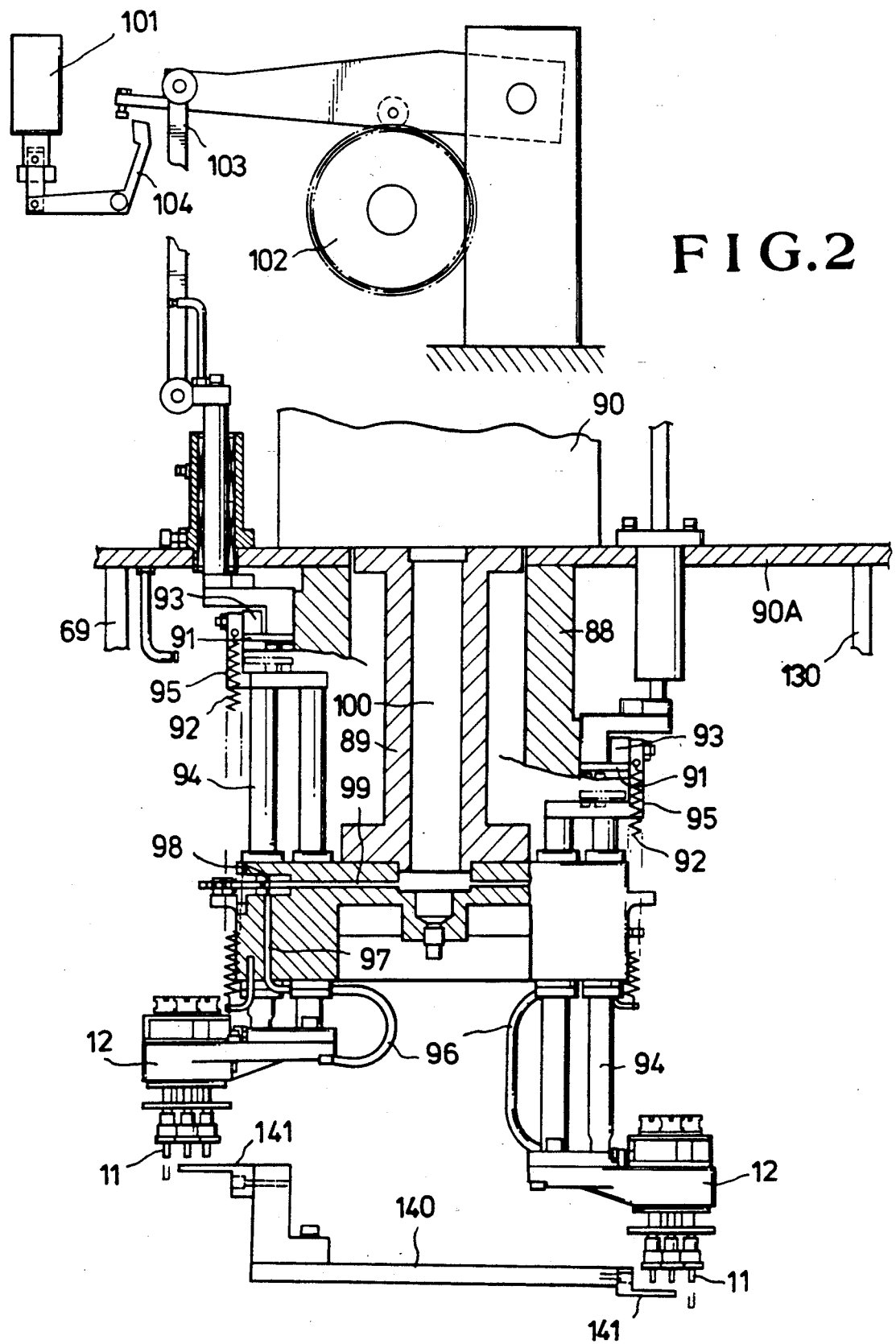
FIG. 2 is a sectional side view, particularly illustrating a rotary disc for the apparatus in FIG. 1.

Next, description will be made below as to the turn table 10 with reference to FIG. 2.

Reference numeral 88 designates a cylindrical cam member for guiding turning movement of the cylindrical turn table 10 which is immovably fastened to a mounting platform 90A in a suspended state. An index unit 90 is mounted on the mounting platform 90A which surrounds the upper end part of a cylindrical portion 89 serving as an upper part of the turn table 10. A cam 91 is formed along the substantially whole distance of the lower peripheral edge of the cam member 88. A roller 93 serving as a sliding member at the upper end of each suction head 12 rolls while coming in pressure contact with the upper surface of the cam 91 under the effect of resilient force of a spring 92, whereby the suction head 12 turns along with the turn table 10 while it is vertically displaced in accordance with the contour of the cam 91. Each suction head 12 is provided with a pair of upright standing guide rods 94 which vertically displaceably extend through the turn table 10, and a holding member 95 for rotatably holding a roller 93 is immovably mounted on the upper ends of the guide rods 94. Consequently, each suction head 12 is vertically displaceably supported on the turn table 10. In addition, the apparatus of the present invention includes a base 140 from which an opposing pair of stopper plates 141 extend in order to assure that each chip component 4 is firmly held on the suction head 12 under the effect of air suction in the suction station I in response to downward displacement of the suction head 12 but downward displacement of a plurality of suction nozzles 11 exclusive of a required suction nozzle is inhibited by the stopper plate 141 when the chip component 4 is mounted on the printed-circuit board 11 in the mounting station IV.

Reference numeral 96 designates a hose serving as a connecting member which is communicated with a vacuum pump which is not shown in the drawings. The upper end of the hose 96 is connected to a joint hose 97 which extends through the turn table 10. The joint hose 97 is communicated with the vacuum pump via a switch valve 98, a transversely extending air passage 99 and a central air suction passage 100.

Reference numeral 101 designates a suction type clutch solenoid for inhibiting downward displacement of the suction head 12 to interrupt a sucking operation in the suction station I, as required. The clutch solenoid 101 includes a contact lever 104 adapted to come in contact with a lever 103 for vertically displacing the suction head 12 by driving a cam mechanism 102 so as not to allow the lever 103 to be displaced downwardly. Namely, as long as the clutch solenoid 101 is kept demagnetized, the contact lever 104 comes in contact with the lever 103 thereby to inhibit the lever 103 from being displaced downwardly. It should be added that a lever similar to the lever 103 in structure is arranged also in the mounting station IV.

Next, description will be made below as to the nozzle position locating unit 70 in the suction station I with reference to FIG. 3.

Reference numeral 71 designates a nozzle position locating rod which is vertically displaceably fitted into a nozzle position locating member 73. The nozzle position locating member 73 includes a nozzle position locating engagement portion 74 at the lower end thereof and it is immovably held by a holding member 72 secured to a mounting plate 69 which is firmly supported by the mounting platform 90A in a suspended state. A pin 76 is projected outward of a vertically extending elongated hole 75 in the nozzle position locating member 73. As shown in the drawing, the engagement portion 74 is downwardly tapered to come in engagement with the fitting groove 11A. The nozzle position locating rod 71 includes a retaining portion 78 for retaining a spring 77 serving as cushioning means between the retaining portion 78 and the bottom of the nozzle position locating member 73, and a turn lever 81 pivotally connected via a rod end 80 to a lever 79 adapted to be vertically displaced by a cam mechanism 82 is brought in engagement with the retaining portion 78. As the lever 79 is vertically displaced, the turn lever 81 is turned up or down so that the nozzle position locating rod 71 is vertically displaced against the resilient force of the spring 77 or under the effect of the resilient force of the spring 77.

Reference numeral 83 designates a position locating clutch solenoid for inhibiting downward displacement of the nozzle position locating unit 70 caused by downward displacement of the lever 79. The clutch solenoid 83 includes an engagement lever 84.

Next, description will be made below with reference to FIG. 4 as to the recognizing unit 14 mounted in the first nozzle rotation correcting station II.

Reference numeral 120 designates a CCD camera having a high magnification for recognizing the present state wherein a small-sized chip component 4 is brought up in close contact with the suction nozzle 11 under the effect of an air suction. Reference numeral 121 designates another CCD camera having a small magnification for recognizing a large-sized chip component 4.

The CCD camera 121 recognizes via a plurality of lenses 127, 128A, 128B, 129A and 129B in a box 122 to be described later an image of the chip component 4 derived from penetration and reflection of light coming from the chip component 4 via a plurality of prisms 123, 124, 125 and 126 in the box 122 which is located below the chip component 4 when the latter is conveyed to a predetermined position above the recognizing unit 14. Specifically, when the CCD camera 120 having a high magnification recognizes a small-sized chip component 4, an image of the chip component 4 is recognized via the prism 123, the lens 127, the prisms 124 and 126 and the lenses 128A and 129B. To the contrary, when the CCD camera 121 having a low magnification is shifted from the CCD camera 120 having a high magnification to recognize a large-sized chip component 4, an image of the chip component 4 is recognized via the prism 123, the lens 127, the prisms 124 and 125 and the lenses 128B and 129B. It should be noted that the box 122 is clamped between an opposing pair of camera holding plates 130 (of which other one is not shown in the drawing) on the mounting platform 90. An available range where a size of each of chip components 4 to be recognized can be processed is preset for each of the both CCD cameras 120 and 121. The available ranges for the CCD cameras 120 and 121 are stored in a RAM 40 which will be described in more details later.

Reference numeral 131 designates a motor for forwardly or rearwardly displacing the lens 127 depending on the differential thickness of each chip component 4 for the purpose of focusing the chip component 4. As the motor 131 is rotated, a cam 132 is rotated and thereby a bearing 133 is slidably displaced in accordance with a track on the cam 132 so that a lens mount 135 is forwardly displaced via a linear way 134 in an arrow-marked direction as seen in the drawing. It should be noted that the lens mount 135 is normally biased by a spring (not shown) in the opposite direction to the arrow-marked direction.

Reference numerals 117A, 117B, 118A and 118B designate a light source in the form of a LED for irradiating light toward light scattering plates 110 and 111 when each chip component 4 is recognized, respectively. The light sources 117A, 117B, 118A and 118B are attached to the box 122 with the aid of attachments 136 and 137.

Next, description will be made below as to the first and second nozzle rotation position locating units 22 and 23 for the first and second nozzle rotation correcting stations II and III. Since the first and second nozzle rotation position locating units 22 and 23 are identical to each other in structure, description will be made only as to the first nozzle rotation position locating unit 22 with reference to FIG. 5 and FIG. 6 for the purpose of simplification.

Reference numeral 22A designates a first nozzle rotating motor serving as a power supply source for rotating the suction nozzle 11 by an angle of $\theta$. The motor 22A includes an output shaft 25 which is operatively connected via a coupling 26 to a nozzle rotating member 28 fitted into a bearing 27. The nozzle rotating member 28 vertically displaceably holds a nozzle rotating rod 29. The nozzle rotating rod 29 may vertically be displaced by using a plurality of ball splines.

The nozzle rotating rod 29 is vertically displaceably fitted into the nozzle rotating member 28 and includes an engagement portion 30 for rotating the suction nozzle 11 at the lower end thereof. As is best seen in FIG. 5, a pin 31 is protruded outward of a vertically extending slot 32 on the nozzle rotating member 28. The engagement portion 30 is downwardly tapered so as to come in engagement with the engagement groove 11A on the suction nozzle 11. The nozzle rotating rod 29 includes a retaining portion 34 for retaining a spring 33 between the bottom surface of the nozzle rotating member 28 and the retaining portion 34 to serve as cushioning means. A turn lever 37 pivotally connected via a rod end 36 to a lever 35 adapted to be vertically displaced by a cam (not shown) serving as a driving power source is brought in engagement with the retaining portion 34. As the lever 35 is vertically displaced, the turn lever 37 is turned up or down, whereby the nozzle rotating rod 29 is vertically displaced against a resilient force of the spring 33 or under the effect of the resilient force of the spring 33.

Reference numeral 42 designates a X-coordinate linear guide and reference numeral designates a Y-coordinate linear guide. The both linear guides 42 and 43 are located above the engagement portion 30. The nozzle rotating rod 29 includes a linear guide retaining member 44 at the lowermost end thereof. A rail 42A for the X-coordinate linear guide 42 is fastened to the retaining member 44, and the linear guide 42 includes a movable block 42B to which a rail 43A of the Y-coordinate linear guide 43 is fastened. The linear guide 43 includes a movable block 43B to which the engagement portion 30 is fixedly secured. In addition, the linear guide 42 is provided with stoppers 45A and 45B and the linear guide 43 is provided with stoppers 46A and 46B (the stopper 46B being not shown in FIG. 5) for the purpose of defining the extent of slidable movement of the linear guides 42 and 43 within the operative range defined by the engagement groove 11A.

Next, description will be made below with reference to FIGS. 8 and 9 as to the nozzle rotation position locating unit 24 in the nozzle original point position locating station VII shown in FIG. 1. Same or similar components to those for the first nozzle rotation position locating unit 22 are identified by same reference numerals. Thus, repeated description will not be required.

As shown in FIG. 9, a first cavity 50 and a second cavity 51 communicated with the first cavity 50 and having an inner diameter smaller than that of the first cavity 50 are formed in the interior of an engagement portion 30A which is secured to the nozzle rotating rod 29.

Reference numeral 52 designates a contact rod serving as braking means. The contact rod 52 is rotatably supported by the engagement portion 30A, while an engagement portion 54 of the contact rod 52 is brought in engagement with a stepped portion 53 between the first cavity 50 and the second cavity 51 under the effect of resilient force of a spring 55. As is apparent from FIG. 9, the contact rod 52 is projected downwardly of the lower end of the engagement portion 30A. When the lowermost end of the contact rod 52 comes in contact with a contact portion 11B in the engagement groove 11A, the engagement portion 54 of the contact rod 52 is released from the engaged state with the stepped portion 53, whereby the contact rod 52 is held to freely rotate regardless of how far the engagement portion 30A is rotated. To facilitate free rotation of the contact rod 52, a thrust bearing 61 is disposed as a retainer for the spring 55 at the upper surface of the first cavity 50, i.e., on the retaining side of the spring 55 for the nozzle rotation rod 29. Thus, a rotational force generated by twisting of the spring 55 due to rotation of the nozzle rotation rod 29 is not transmitted to the contact rod 52 any longer.

In FIG. 10, reference numeral 38 designates an interface. The turn table 10, the recognizing unit 14, the driving gear 16, the first, second and third nozzle rotation position locating units 22, 23 and 24, a counter 62 and an information unit 63 are connected to the interface 38 so that the aforementioned components to be controlled are controlled by a central processing unit (hereinafter referred to as a CPU) 39 serving as controlling means.

Reference numeral 40 designates a random access memory (hereinafter referred to as a RAM) serving as storing means. Data on the position assumed by a center of rotation of each suction nozzle 11, data on the position of each chip component 4 recognized by the recognizing unit 14 and data on the position of each chip component 4 on the printed-circuit board 5 (as seen in the X-direction, the Y-direction and the θ-direction) are stored in a predetermined area of the RAM 40.

Reference numeral 64 designates a read only memory (hereinafter referred to as a ROM) serving as storing means in which data on a program for open-loop correcting operations and data on a program for closed-loop correcting operations are stored. In addition, a program related to a mounting operations for each chip component 4 is stored in the ROM 64.

In view of a possibility that the preset position of a center of rotation of the suction nozzle 11 may incorrectly be deviated due to variation of a temperature as time elapses, a jig having a hole formed thereon may be brought up in a close contact with the suction jig 11, when the present temperature exceeds a preset temperature and a predetermined period of time elapses. In this case, the jig is rotated, as the suction nozzle 11 is rotated. When the jig is rotated to a predetermined angular position, the position assumed by the hole of the jig is recognized by the recognizing unit 14 thereby to calculate a quantity of deviation of a rotation center of the suction nozzle 11, and then the quantity of deviation derived from the calculation conducted by the CPU 39 is stored in the RAM 40. Alternatively, the quantity of deviation may be added to data on the position assumed by the rotation center of the suction nozzle 11.

The CPU 39 has a driving circuit 41 connected thereto to which a servo-motor 13 for the turn table 13, a servomotor motor 15 for driving a plurality of gears and servo-motors 22A, 23A and 24A for rotating first to third nozzles are connected.

Next, description will be made below as to a setting operation for making determination as to whether the suction nozzle 11 should be corrected via closed-loop correction or via open-loop correction (hereinafter referred to as closed-loop/open-loop shifting). An operator completes preparation of data on the closed/open shifting NC depending on the kind of a chip component 4, wherein the data are displayed on the screen of a monitor television (not shown) as shown in the form of a table in FIG. 11 in accordance with a procedure to be described later.

Specifically, referring to the table in FIG. 11, a chip component 4 is identified by a component number "R₁" is classified into a chip component which belongs to a category "presence of leads". Since the chip component 4 has many leads and a comparatively narrow pitch between adjacent leads, it should be mounted on the printed-circuit board 5 at a high accuracy. Further, since it is required that rotation of the suction nozzle 11 is corrected at a considerably high accuracy, a symbol "1" is set to the chip component 4 so as to carry out closed-loop correction and moreover the allowable error range is set to ±1 degree (it is set to ±10 in terms of data).

Next, a chip component 4 identified by a component number "R₂" is classified into a category "absence of lead". Since the chip component 4 does not require an accuracy which is not so high, a symbol "0" is set to the chip component 4 so as to carry out open-loop correction. At this time, the allowable error range is set to ±2 degrees (it is set to ±20 in terms of data).

Next, respective chip components 4 are classified depending on the kind of each f the chip components 4 and a setting operation is then performed for shifting of closed-loop correction to open-loop correction and vice versa with respect to the respective chip components 4.

The CPU 39 determines whether the symbol set to the respective chip components 4 is "0" or "1". Thereafter, a correction operation is performed based on results derived from the determination made by the CPU 39.

Next, operation of the apparatus as constructed in the above-described manner will be described bellow with reference to the accompanying drawings.

First, before a mounting operation is initiated, the recognizing unit 14 recognizes the present position of a rotation center of each suction nozzle 11 (with a reference point, e.g., an image center of each of the CCD cameras 120 and 121 serving as a reference). Then, data on the present position assumed by the rotation center of the suction nozzle 11 are stored in the RAM 40.

Alternatively, a recognizing operation for the present position assumed by the rotation center of the suction nozzle 11 may be performed in such a manner as described below. Namely, the jig is held on the suction nozzle 11 under the effect of air suction so that the jig is rotated as the suction nozzle 11 is rotated. The hole on the jig is recognized by the recognizing unit 14 at each angular position set by rotation of the suction nozzle 11 and then a calculating unit (not shown) determines the present rotation center of the suction nozzle 11 based on results derived from the above-described recognition conducted by the recognizing unit 14.

In addition, a preliminary mounting operation is practically performed for a certain chip component 4 under a condition that a mounting position is varied for the chip component 4. Thereafter, a quantity of deviation of the practically mounted position from the rotation center of the suction nozzle 11 is measured and a value representative of the quantity of deviation is inputted into the RAM 40 via an inputting unit (not shown).

As the servo-motor 8 is rotated, the feeding platform 6 is displaced toward the suction station I so that a required component feeding unit 7 stands by at the position where a chip component 4 is taken out of the feeding platform 6.

Figures 12, 13:
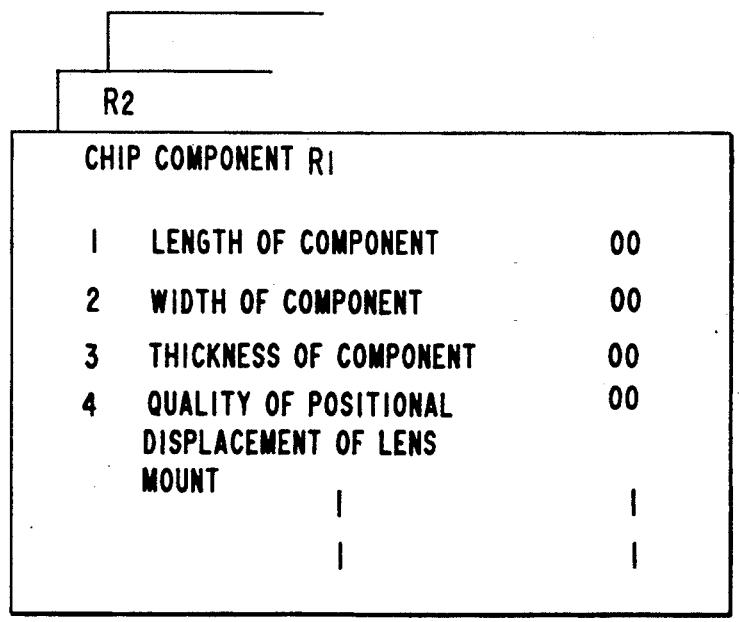
FIG. 12 is a diagram in the form of a table which illustrating data displayed on the screen of the monitor television to represent a program for mounting electronic components.
FIG. 13 is a diagram in the form of a table which illustrates data concerning each chip component to be mounted.
Figure 14:
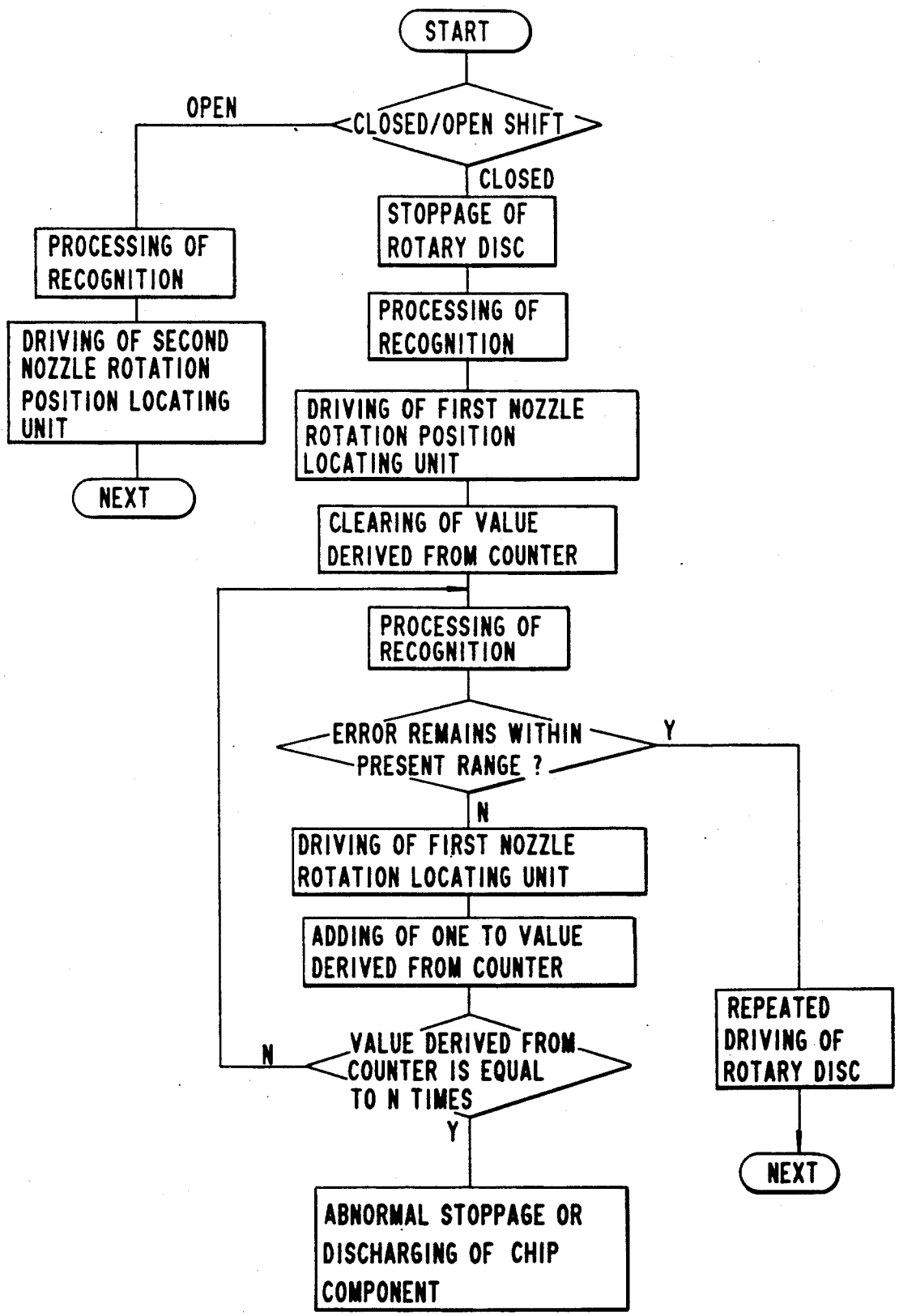
FIG. 14 is a flowchart which illustrates a series of correcting operations each for correcting rotation of a suction nozzle.

Then, the suction nozzle 11 is displaced to a position above the chip component 4 in the component feeding unit 7 identified by the component number "R₁" based on a step number "1" represented by data on a mounting program which are displayed on the screen of a monitor television as shown in FIG. 12 (wherein the step number "1" represents that the chip component 4 is located at a first position for a mounting operation to be performed in an order of successively mounting chip components). While the suction nozzle 11 stays in the suction station I, the lower end of the suction nozzle 11 on the suction head 12 should be lowered to the present position assumed by the chip component 4 in the component feeding unit 7. To this end, a roller 93 at the upper end of the suction head 12 is placed on a vertically displaceable rail (not shown) in a region where extension of the cam 91 of a cam member 88 is interrupted, and the vertically displaceable rail is then lowered. At this time, the suction nozzle 11 may be rotated due to shock appearing at the time of mounting of the chip component 4 under the effect of air suction or vertical positional displacement of the suction nozzle 11. This causes the original position correctly located in the original point position locating station VII to be undesirably deviated from the correct position with the result that the direction of extension of the engagement groove 11A varies and thereby a certain amount of error appears at the next time when rotation is to be corrected. To prevent an occurrence of error in that way, the following operations are performed. Namely, when the chip component 4 is brought in close contact with the suction nozzle 11 under the effect of air suction, the cam mechanism 82 is actuated to lower the vertically displaceable lever 79, whereby the turn lever 81 is turned downwardly. Thus, the nozzle position locating engagement portion 74 is brought in engagement with the engagement groove 11A on the top of the suction nozzle 11. While the engagement portion 44 is held in the fitting engagement groove 11A, the lower end of the suction nozzle 11 is lowered to the position where the chip components 4 is received in the component feeding unit 7. Consequently, the chip component 4 is brought up to the suction nozzle 11, while undesirable rotation of the suction nozzle 11 due to shock appearing at the time of mounting of the chip component 4 under the effect of air suction or vertical positional displacement of the suction head 11 is suppressed reliably.

Next, description will be described below as to a correcting operation for rotation of the chip component 4 in the $\theta$-direction in the first nozzle rotation correcting station II.

First, a determining unit in the CPU 39 determines whether or not a size of the chip component 4 remains within the error range set for a size of the component which can be processed by the CCD camera 120 having a high magnification or the CCD camera having a low magnification, based on various data on respective chip components 4 shown in FIG. 13 (e.g., length, width and thickness of each chip component, quantity of positional displacement of each lens mount or the like). For example, when the CCD camera 120 having a high magnification recognizes a chip component 4, the CCD camera 120 having a high magnification recognizes the present position of the chip component 4 which is offset from an image center on the screen thereof, and data $(X_1, Y_1$ and $\theta_1)$ derived from the above-described recognition are then stored in the RAM 40. When the small-sized chip component 4 is recognized, it is assured that dispersed light is irradiated toward the chip component 4 via the first dispersing plate 110 without fluctuation of illumination regardless of how wide an annular clearance is formed on the second dispersing plate 111 for the purpose of vertically displacing the nozzle 11. Specifically, light emitted from a light source 117A is irradiated toward the small-sized chip component 4 located below the first dispersing plate 110 with repeated reflection and dispersion in the dispersing plate 110, because the light permeates through the clearance of the dispersion plate 110, while dispersing from side portions 115 and 116 of the latter, with a reduced quantity of dampening of the light at an intermediate part 113 accompanied by reflection and dispersion of the light on the upper surface of the dispersing plate 110. Consequently, desirable illuminating light having few fluctuation of illumination is obtainable. Next, description will be made below as to a result derived from a correcting operation for correcting data ($\theta$) on angles among a plurality of results derived from the aforementioned recognition.

It should be noted that data ($\theta_1$) on the recognized angle represents an angle defined, e.g., by intersection lines comprising an extension line extending from one side of the image center and another extension line extending from a certain end surface of the chip component 4 serving as a reference.

Here, comparison is made by a comparing unit (not shown) with respect to data on a certain angle $(\theta_1 - \alpha)$ in the first nozzle rotation correcting station II and the above-described data on the recognized angle ($\theta_1$) via backward calculation for data on a mounting angle ($\theta_1$) among a large number of data on mounting positions stored in the RAM 40. If it is found that a certain amount of deviation is present, this amount of deviation represented by $(\theta_1 - \alpha - \theta_1)$ is calculated by a calculating unit (not shown) and results derived from the calculation are stored in the RAM 40. At the same time, the CPU 39 executes correction for rotation of the suction nozzle 11. It should be added that the CPU 39 executes closed-loop correction with reference to numerically controlled data shown in FIG. 11 such that the allowable error range set for the chip component 4 identified by "$R_1$" remains within $\pm 1$ degree ($\pm 10$ in terms of number of data).

Next, description will be made below as to operations for correcting rotation of the suction nozzle 11 in the $\theta$-direction in the first nozzle rotation correction station II based on a flowchart which represents a plurality of operations to be performed for correcting rotation of the suction nozzle 11.

First, after the turn table 10 stops turning movement, the vertically displaceable lever 35 is lowered by actuation of the cam 91 and thereby the turn lever 37 is vertically turned. Thus, the engagement portion 30 is brought in engagement with the tapered surfaces 11E and 11F in the engagement groove 11A on the suction nozzle 11 under the effect of resilient force of the spring 33. Thereafter, the motor 22A is rotated by a certain angle equivalent to the amount of deviation represented by $(\theta_1 - \alpha - \theta_1)$, whereby the suction nozzle 11 is rotated for determining a correct position to be assumed by the chip component 4. In a case where a certain amount of eccentricity is existent between the engagement portion 30 and the engagement groove 11A when the engagement portion 30 is brought in engagement with the engagement groove 11A, the linear guides 42 and 43 are displaced under the effect of biasing force given by the spring 33 in the X-direction as well as in the Y-direction until the eccentricity between the engagement portion 30 and the engagement groove 11A disappears. As a result, a load exerted on the suction nozzle 11 in the radial direction is alleviated.

Alternatively, arrangement may be made such that a linear guide operates only in a single direction. Also in this case, the load exerted on the suction nozzle 11 in the radial direction can be alleviated. After completion of the operation for correcting the position assumed by the suction nozzle 11, the present state wherein the chip component 4 has been firmly held on the suction nozzle 11 under the effect of air suction is recognized again by the recognizing unit 14 so as to recognize that the suction nozzle 11 is rotated by an angle equivalent to the amount of deviation represented by ($\theta_1 a - \theta_1$). When it is found that errors recognized after completion of the correcting operation remain within the allowable error range set for the respective electronic components 4 and stored in the RAM 40, the turn table 10 is rotated again so that the suction head 12 is displaced to the next station.

While the chip component 4 stays in the mounting station IV, the printed-circuit board 5 is displaced in the X-direction as well as in the Y-direction by actuating the X-Y coordinate table 1 in the X-direction as well as in the Y-direction, whereby the chip component 4 is mounted at a predetermine position represented by $X_1$ and $Y_2$ in the coordinate system.

The aforementioned correcting operation continues until errors appearing after completion of the correcting operation remain within the allowable error range. Of course, there is a possibility that errors do not remain within the allowable error range irrespective of how many times correction operation is repeatedly performed. For the reason, it is preferable that the number of times of correction operations to be repeatedly performed is preset so as to allow a series of correcting operations to be repeatedly performed until the preset number of times (e.g., N times) counted by a counter 62 is reached.

In a case where it is found that errors appearing after completion of correcting operations repeated by N times do not remain within the allowable error range, operation of the apparatus is immediately interrupted and the informing unit 63 informs an operator of the present abnormal situation.

When the CPU 39 determines based on results derived from recognition of the recognizing unit 14 that errors recognized by the recognizing unit 14 with the chip component 4 do not remain the allowable error range, the turn table 10 is rotated further along with the chip component 4 to reach the discharging station V where the incorrectly mounted chip component 4 is discharged from the turn table 10 to the outside of the apparatus. Namely, the chip component 4 of which errors do not remain within the allowable error range may be discharged from the turn table 10 in the discharging station V without immediate interruption of operation of the apparatus.

Next, as the driving gear 16 is rotated after it meshes with a gear (not shown) on the suction head 12, the suction head 12 is rotated so that a next suction nozzle 11 to be used is selected in the nozzle selecting station VI.

Next, an original point position locating operation is performed in the nozzle original point locating station VI for the suction nozzle 11 which has been selected in the preceding nozzle selecting station VI. Since the suction nozzle 11 is rotated and corrected corresponding to a quantity of deviation of the chip component 4 from a correct position in the first nozzle rotation correcting station II or the second nozzle rotation correcting station III, an original point to be assumed by the suction nozzle 11 as seen in the direction of rotation of the suction nozzle 11 to serve as a reference point when a chip component 4 is firmly held on the suction nozzle 4 under the effect of air suction becomes different from chip component to chip component. For the reason, a position to be assumed by the original point should coincide with a predetermined position, before the chip component 4 is firmly held on the suction nozzle 11 under the effect of air suction.

To this end, a position where rotation of the third nozzle rotating servo-motor 24A is interrupted is preset and the position to be assumed by the original point as seen in the direction of rotation of the suction nozzle 11 is correctly determined by activating the nozzle rotation position locating unit 24. Specifically, e.g., when the engagement portion 30A intersects the engagement groove 11A at a certain angle, first, the engagement portion 30A is lowered while it is rotated, whereby a contact rod 52 resiliently biased downwardly by a spring 55 is brought in contact with a counterpart 11B in the suction nozzle 11 (see FIG. 15). As the contact rod 52 continuously depresses the counterpart 11B, the engagement portion 30A becomes ready to rotate. Namely, the engagement portion 30A becomes freely rotatable relative to the contact rod 52, whereby the suction nozzle 11 is not rotated together with the engagement portion 30A until the engagement portion 30A is brought in engagement with the engagement groove 11A. More specifically, rotation of the engagement portion 30A, i.e., rotational force of the nozzle rotating rod 29 is transmitted to the upper part 61A of a thrust bearing 61 but it is not transmitted to the lower part 61C owing to a rolling effect given by a plurality of balls 61B. Thus, the direction of extension of the engagement portion 30A coincides with the direction of extension of the engagement groove 11A, before the engagement portion 30A is rotated by a maximum angle of 180 degrees. Consequently, the engagement portion 30A is brought in engagement with the engagement groove 11A under the effect of resilient force of a spring 55, whereby as the engagement portion 30A is rotated, the suction nozzle 11 is rotated. When the suction nozzle 11 is rotated to an inoperative position where rotation of the suction nozzle 11 is stopped, the suction nozzle 11 is held immovable while the direction of extension of the engagement portion 30A coincides with the direction of extension of the engagement groove 11A (see FIG. 16). As a result, the suction nozzle 11 is always located at the original point position, after rotation of the suction nozzle 11 is stopped.

Alternatively, the suction nozzle 11 may be located at the original point position in such a manner as described below. Namely, the original point location is stored in the RAM 40, a value indicative of the original point position and a quantity of rotation of the suction nozzle 11 at the time of the aforementioned correction are calculated by the calculating unit, a value derived from the calculation is subtracted from the value representative of 180 degrees and the nozzle rotating servo-motor 24A is then rotated by an angle equal to a value derived from the subtraction so that the direction of extension of the engagement groove 11A coincides with the direction of arrangement of original point locations.

Further, the suction nozzle 11 may be located at the original point position by rotating the servo-motor 24A in the reverse direction by a quantity of rotation of the suction nozzle 11 at the time of the aforementioned correcting operation.

Next, a chip component 4 identified by a component number "$R_2$" is firmly held on the suction nozzle 11 under the effect of air suction at a step identified by NO.

"2" in program data which are displayed on the screen of a monitor television. The chip component 4 is recognized by the recognizing unit 14 and open-loop correction is then carried out for the suction nozzle 11 in the second nozzle rotation correcting station III based on results derived from the recognition of the recognizing unit 14 and the displayed data indicative of a mounting angle $O_2$. At this time, the allowable error range is set to ±2 degrees but a correcting operation is performed irrespective of whether results derived from the correcting operation remain within the allowable error range or not.

First, the present state wherein the chip component 4 has been firmly held on the suction nozzle 11 under the effect of air suction is recognized by the recognizing unit 14. When it is found that a correcting operation need to be performed, the correcting operation is performed by actuating the second nozzle rotation position locating unit 23 in the second nozzle rotation correcting station III. Incidentally, the correcting operation is performed in the same manner as that in the first nozzle rotation position locating unit 22. The reason why the correcting operation is performed in the second nozzle rotation correcting station III consists in that a long period of time is required when plural correcting operations (recognizing operation and correcting operation) are performed in a single station (e.g., first nozzle rotation correcting station II). Additionally, another correcting operation may be performed in the first nozzle rotation correcting station II. Otherwise, another correcting operation may be performed for all kinds of chip components 4 in the second nozzle rotation correcting station III.

On completion of the correcting operation, each chip component 4 is mounted on the printed-circuit board 5 at a predetermined position represented by $X_2$ and $Y_2$ in the coordinate system.

A series of mounting operations are successively performed for the chip components 4 in the entirely same manner as described above.

Figure 17:
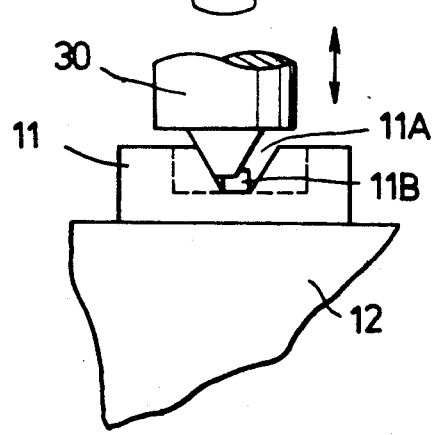
FIG. 17 are a perspective view, particularly illustrating eccentric engagement of the engagement portion with the engagement groove.
Figure 18:
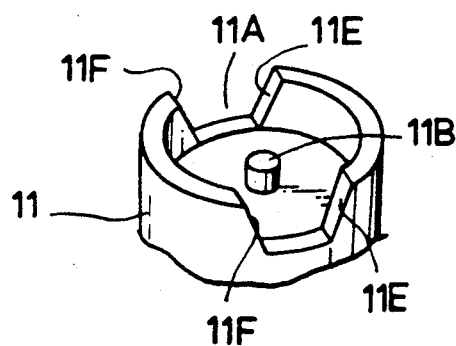
FIG. 18 is a perspective view, particularly illustrating the engagement groove.
Figure 19:
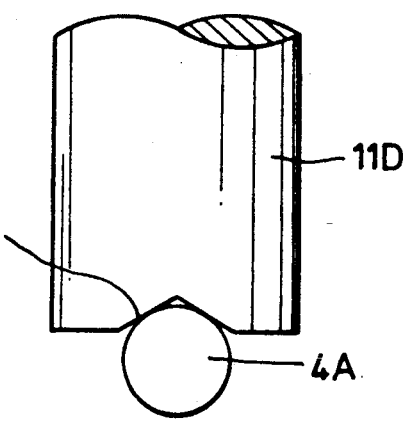
FIG. 19 is a schematic view, particularly illustrating a directional suction nozzle suction nozzle on which a cylindrical chip component is firmly held under the effect of air suction.

Incidentally, description has been made above with reference to FIG. 4 as to a case where the engagement portion 30 is brought in engagement with the engagement groove 11A merely lowering the engagement portion 30, wherein the direction of extension of the engagement portion 30 coincides with the direction of extension of the engagement groove 11A. In a case where the engagement portion 30 is eccentrically offset from the engagement groove 11A (as shown in FIG. 17), when the engagement portion 30 comes in contact with one of the tapered surfaces 11E and 11F of the engagement groove 11A (see FIG. 18), the suction nozzle 11A can be rotated by rotating the engagement portion 30 in the same direction as the direction wherein the engagement portion 30 comes in contact with one of the tapered surfaces 11E and 11F of the engagement groove 11A. Therefore, with respect to a directional suction nozzle 11D having a V-shaped groove 11C formed thereon for firmly holding a cylindrical chip component 4A under the effect of air suction as shown in FIG. 19, the direction of extension of the engagement groove 11A is required to coincide with the direction of extension of the V-shaped groove 11C. With this arrangement, the axial direction of the chip component 4A becomes coincident with the direction of extension of the V-shaped groove 11C in conformity with the configuration of the chip component 4A. Thus, the direction of stoppage of the engagement groove 11A coincides with the direction of stoppage of the V-shaped groove 11C with result that the chip component 4A can reliably be held on the suction nozzle 11D under the effect of air suction.

In the aforementioned embodiment of the present invention, the spring 30 is arranged on the engagement portion 30 side as cushioning means. Alternatively, the spring 30 may be arranged on the engagement groove 11A side, i.e., on the suction nozzle 11 side. In this case, the spring 30 may be arranged, e.g., between the lower end surface of the suction nozzle 11 having the engagement groove 11A formed thereon and the upper end surface of the suction head 12.

In addition, braking means may be arranged on the suction head 12 side so as to allow the braking means to come in contact with the upper part of the suction nozzle 11 thereby to inhibit rotation of the suction nozzle 11.

In the aforementioned embodiment of the present invention, the first nozzle rotation position locating unit 22 and the second nozzle rotation position locating unit 23 are mounted on the linear guides 42 and 43. Additionally, a third nozzle rotation position locating unit 24 may be mounted on the linear guides 42 and 43.

According to the above-described embodiment of the present invention, the CPU 39 has a number of data on closed/open shift stored therein which are classified in accordance with the kind of chip components 4 to be mounted. Next, description will be made below with reference to FIGS. 21 and 22 as to an apparatus for automatically mounting electronic components in accordance with other embodiment of the present invention wherein the apparatus has data on closed/open shift stored in the CPU 39 corresponding to data on a mounting operation (so-called numerical control data).

FIG. 20 is a diagram in the form of a table which shows data on chip components 4 to be mounted, wherein the data are displayed on the screen of the monitor television while they are classified depending on the kind of each chip component 4.

FIG. 21 is a diagram in the form of a table which shows data concerning a program to be executed by the apparatus of the present invention based on data on the closed/open shift which are preset corresponding to data on each mounting operation to be performed.

Referring to the data shown on the table in FIG. 21, at a step identified by a step number "1", open-loop correction is carried out for a chip component 4 within the allowable error range of ±2 degrees and at a step identified by a step number "2", open-loop correction is carried out for a chip component 4 within the allowable error range of ±1 degree and 50 minutes. On the other hand at a step identified by a step number "2", closed-loop correction is carried out for a chip component 4 within the allowable error range of ±1 degree and 10 minutes. These chip components 4 which have been corrected in that way are mounted on the printed-circuit board 5 at predetermined positions represented by X-coordinates and Y-coordinates, i.e., $(X_1, Y_1)$, $(X_2, Y_2)$ and $(X_3, Y_3)$ in the coordinate system.

Thereafter, a series of mounting operations are successively performed in the same manner as described above.

In the aforementioned embodiments, the allowable error range is preset for each chip component 4 (refer to FIG. 11 and FIG. 20). Alternatively, the allowable error component 4 may be preset only for chip components 4 for which closed-loop correction should be carried out (refer to FIG. 22).

Speaking reversely, the CPU 39 may carry out control while reading a number of preset data in such a manner that closed-loop correction is carried out for chip components 4 for which the allowable error range has been preset and open-loop correction is carried out for chip component 4 for which the allowable error range has been not preset. With such control, any particular data on closed/open shift are not required.

In addition, as shown inn FIG. 23, closed-loop correction may be carried out in the same manner as described above, provided that ann order of mounting operations to be performed for chip components is preset so as to make it possible to preset the allowable error range for each step to be performed in accordance with the foroegoing order.

Further, as shown by a dotted line in FIG. 10, the apparatus of the present invention may be equipped with a closed/open shift switch 65 so as to allow an operator to make selection as to whether closed-loop correction should be carried out for all chip components 4 or open-loop correction should be carried out for all chip components 4 to correct rotation of each chip component 4.

FIGS. 24 and 25 are a diagram in the form a table, respectively, which shows the limited number of times of closed-loop correction to be performed by an apparatus for automatically mounting electronic components in accordance with modified embodiments of the present invention based on data on chip components shown in the table.

First, in the embodiment shown in FIG. 24, the counter 62 calculates the number of times of correcting operations to be performed based on data on the limited number of times of correcting operations which have been preset for each chip component. If it is found that the number of times of correcting operations which have been already performed do not reach the limited number of times of correction operations, another correcting operation is repeatedly performed further. Specifically, with respect to a chip component 4 identified by a component number "$R_1$", it is possible to repeatedly perform another correcting operation by the maximum five times based on date "5" on the limited number of times of correcting operations. With respect to a chip component 4 identified by the next component number "$R_2$", open-loop correction need to be carried out for the chip component 4. Thus, numeral "0" is preset for the chip components 4 as data on the limited number of times of correcting operations to be performed for the chip component 4.

Next, in the embodiment shown in FIG. 25, the CPU 39 reads a numerical value representative of preset data on the allowable error range. If it is found that the numerical value derived from the reading of the CPU 39 remains within a certain preset error range stored in the RAM 40 (in this embodiment, e.g., the allowable error range of ±1 degree and thirty minutes to ±1 degree and ten minutes represents the limited number of four times of correcting operations to be performed, the allowable error range of ±1 degree to ±50 minutes represents the limited number of five times of correcting operations to be performed, --- ), another correcting operation can be performed by the limited number of times of correction operations to be performed correcting to the preset error range.

Next, FIG. 26 and FIG. 27 are a diagram in the form of a table, respectively, which shows how the limited number of times of correction operations to be performed is changed for each step to be performed by an apparatus for automatically mounting electronic components in accordance with another modified embodiments of the present invention.

In the embodiment shown in FIG. 26, the counter 62 calculates the number of times of correcting operations to be performed in the same manner as in the embodiment shown in FIG. 24. If it is found that the number of times of correcting operations which have been already performed does not reach the limited number of times of correction operations to be performed, another correcting operation can repeatedly be performed further.

Next, inn the embodiment shown in FIG. 27, the CPU 39 reads a numerical value representative of data on the allowable error range which has been preset for each step to be performed in the same manner as in the embodiment shown in FIG. 25. If it is found that the numerical value derived from the reading of the CPU 339 does not reach the limited number of times preset in that way, another correcting operation can be performed further.

Additionally, the limited number of times of correcting operations to be performed may be determined in such a manner as described below.

For example, in an embodiment of the present invention as shown in FIG. 28, the CPU 39 reads a numerical value representative of the limited number of times of correcting operations to be performed by the apparatus of the present invention, wherein the limited number of times of correction operations to be performed is preset for each step shown in the drawing. If it is found that the numerical value derived from the reading of the CPU 39 does not reach the preset limited number of times of operations to be performed, another correction operation is performed further. In a case where a numerical value representative of the limited number of times of correcting operations to be performed is set to "zero", a correcting operation is performed based on the limited number of times of correcting operations to be performed which has been preset for each chip component, with reference to data on the limited number of times of correction operations to be performed for each chip component as shown in FIG. 29. Specifically, a numerical value "0" representative of data on the limited number of times of correcting operations to be performed is preset to a chip component identified by a step number "3" in FIG. 28. In this case, the CPU 39 reads data "$R_3$" on a chip component to which the step number "3" has been preset in that way and then reads data "5" on the limited number of times of correcting operations which have been preset to the chip component number "$R_3$" shown in FIG. 29 corresponding to the chip component data "$R_3$". Thus, a correcting operation is performed based on the numerical value derived from the reading of the CPU 39.

Finally, in an embodiment of the present invention as shown in FIG. 30, the CPU 39 reads a numerical value representative of data on the allowable error range which has been preset for each step. If it is found that a numerical value derived from the reading of the CPU 39 remains within the preset error range stored in the RAM 40 in the same manner as in the embodiment in FIG. 25, another correcting operation is performed further by the limited number of times of correction operations to be performed corresponding to the preset range. When a numerical value "0" is preset to data on the allowable error range, a correcting operation may be performed corresponding to the limited number of times of correcting operations to be performed which has been preset to the chip component data, with reference to the data on the limited number of times of correcting operations to be performed based on the chip component data, as shown in FIG. 29.

As will be apparent from the above description, according to one aspect of the present invention, to enhance an accuracy of angular positions during a series of mounting operations for electronic components, a recognizing unit recognizes an angular position assumed by each electronic components after completion of a rotational correcting operation. If it is found that data derived from the recognizing of the recognizing unit do not remain within the allowable error range, another correcting operation is repeatedly performed further until the resultant data remain within the allowable error range. Consequently, the apparatus of the present invention can improve an accuracy of angular positions to be assumed by electronic components.

In addition, the number of times of correcting operations to be performed by the apparatus of the present invention can definitely be preset to a certain numeral. Alternatively, the number of times of correction operations to be performed may be preset depending on the kind of electronic components to be mounted or for each step of mounting electronic components. Otherwise, the number of times of correction operations to be performed may be determined with reference to the allowable error range. Consequently, the apparatus of the present invention can widely be used in many fields in an electronic industry.

According to other aspect of the present invention, open-loop correction for correcting rotation of each suction nozzle for all electronic components merely by one time after completion of a recognizing operation, depending on the kind of electronic components to be mounted or at every time when an electronic component is mounted on a printed-circuit board or closed-loop correction for correcting rotation of each suction nozzle so as to allow a difference between a recognized angular position and a correct angular position to remain within a certain allowable range under a condition that a rotational correcting operation is repeatedly performed is selectively employed for the apparatus of the present invention. As a result, the apparatus can widely be used in many fields in the electronic industry.

Specifically, in a case where no high accuracy is required for a mounting operation but a cycle time required for the mounting operation need to be shortened, open-loop correction is carried out by the apparatus of the present invention. In contrast with the foregoing case, in a case where a high accuracy is required for a mounting operation but the cycle time may unavoidably be elongated, closed-loop correction is carried out by the apparatus of the present invention. Consequently, the apparatus can widely be used in many fields in the electronic industry.

While the present invention gas been described above with respect to several preferred embodiments thereof, it should of course be understood that it should not be limited only to them but various changes or modifications may be made without departure from the scope of the invention as defined by the appended claims.

What is claimed is:

1. In an apparatus for automatically mounting electronic component having a take-out nozzle rotated by nozzle rotating means based on data on an angular position assumed by an electronic component, the electronic component being firmly held on said take-out nozzle, said angular position being recognized by recognizing means in order to perform a correcting operation so as to cause said electronic component to assume an acceptable angular position, and wherein after completion of said correcting operation, said electronic component being mounted a printed-circuit board, the improvement comprising:

storage means for storing an allowable error range of acceptable angular positions which can be assumed by said electronic component;

comparing means for determining whether or not a present angular position of said electronic component recognized by said recognizing means is within said allowable error range stored in said storage means;

a counter for counting the number of times a correcting operation has been performed in response to the determination made by said comparing means; and controlling means for controlling said nozzle rotating means for performing a correcting operation to be repeatedly performed, until the respective angular positions which have been recognized by said recognizing means after completion of the respective correction operations remain within said allowable error range and moreover allowing said electronic component firmly held on said take-out nozzle not to be mounted on said printed-circuit board when the number of times the correction operation which has been performed reaches a predetermined number which has been preset by said counter.

2. In an apparatus for automatically mounting electronic components having a take-out nozzle rotated by nozzle rotating means based on data on an angular position assumed by ann electronic component, the electronic component being firmly held on said take-out nozzle, said angular position being recognized by recognizing means inn order to perform a correcting operation so as to cause said electronic component to assume an acceptable angular position, and wherein after completion of said correcting operation, said electronic component being mounted a printed-circuit board, the improvement comprising:

storage means for storing an allowable error range of acceptable angular positions which can be assumed by said electronic component;

comparing means for determining whether or not a present angular position of said electronic component recognized by said recognizing means is within said allowable error range stored in said storage means;

a counter for counting the number of times a correcting operation has been performed in response to the determination made by said comparing means; and controlling means for controlling said nozzle rotating means for performing a correcting operation until the respective angular positions which have been recognized by said recognizing means after completion of the respective correcting operations remain within said allowable error range and moreover allowing said electronic component firmly held on said take-out nozzle not be mounted on aid printed-circuit board when the number of times the correcting operation which has been performed reaches a predetermined number which has been preset for each electronic component or when the number of steps of mounting said electronic component reaches the number of counting operations which has been performed by said counter.

3. In an apparatus for automatically mounting electronic components having a take-out nozzle rotated by nozzle rotating means based on data on an angular position assumed by an electronic component, the electronic component being firmly held on said take-out nozzle, said angular position being recognized by recognizing means in order to perform a correcting operation so as to cause said electronic component to assume an acceptable angular position, and wherein after completion of said correcting operation, the electronic component being mounted a printed-circuit board, the improvement comprising:

storage means for storing an allowable error range of acceptable angular positions which can be assumed by said electronic component;

comparing means for determining whether or not a present angular position of said electronic component recognized by said recognizing means is within said allowable error range stored in said storage means;

a counter for counting the number of times a correcting operation has been performed in response to the determination made by said comparing means;

determining means for determining the number of times a correcting operation which has been performed, with reference to said allowable error range; and controlling means for controlling said nozzle rotating means for performing a correcting operation to be repeatedly performed until the respective angular positions which have been recognized by said recognizing means after completion of the respective correcting operations remain within said allowable error range and moreover allowing said electronic component firmly held on said take-out nozzle not to be mounted on said printed-circuit board when the number of times a correcting operation which has been determined by said determining means reaches a predetermined number of times of counting operations to be performed by said counter.

* * * * *